US012637772B2

(12) United States Patent
Lee et al.

(10) Patent No.: US 12,637,772 B2
(45) Date of Patent: May 26, 2026

(54) METHOD FOR CRYSTALLIZATION OF METAL OXIDE THIN FILM BY USING THERMAL DISSIPATION ANNEALING

(71) Applicant: INJE UNIVERSITY INDUSTRY-ACADEMIC COOPERATION FOUNDATION, Gimhae-si (KR)

(72) Inventors: Jewon Lee, Busan (KR); Jae-Young Leem, Busan (KR); Dongwan Kim, Busan (KR)

(73) Assignee: INJE UNIVERSITY INDUSTRY-ACADEMIC COOPERATION FOUNDATION, Gimhae-si (KR)

( * ) Notice: Subject to any disclaimer, the term of this patent is extended or adjusted under 35 U.S.C. 154(b) by 0 days.

(21) Appl. No.: 18/690,589

(22) PCT Filed: Jun. 29, 2022

(86) PCT No.: PCT/KR2022/009339
§ 371 (c)(1),
(2) Date: Mar. 8, 2024

(87) PCT Pub. No.: WO2023/038251
PCT Pub. Date: Mar. 16, 2023

(65) Prior Publication Data
US 2025/0137138 A1      May 1, 2025

(30) Foreign Application Priority Data

Sep. 10, 2021    (KR) ........................ 10-2021-0120838

(51) Int. Cl.
*C23C 18/12*          (2006.01)
*C23C 16/46*          (2006.01)
(Continued)

(52) U.S. Cl.
CPC ........ *C23C 18/1295* (2013.01); *C23C 16/463* (2013.01); *C23C 18/1216* (2013.01);
(Continued)

(58) Field of Classification Search
CPC ............ C23C 18/1295; C23C 18/1216; C23C 18/1233; C23C 18/1245; C23C 18/1254;
(Continued)

(56) References Cited

U.S. PATENT DOCUMENTS

| 2009/0103906 A1* | 4/2009 | Kusuda | ............... F27B 17/0025 |
| | | | 392/407 |
| 2011/0061810 A1* | 3/2011 | Ganguly | ............. H01L 21/0223 |
| | | | 156/345.27 |
| 2020/0234983 A1* | 7/2020 | Yang | ................. H01L 21/67115 |

FOREIGN PATENT DOCUMENTS

| KR | 10-2014-0128132 A | 11/2014 | |
| KR | 10-2019-0022010 A | 3/2019 | |
| KR | 102573025 B1 * | 8/2023 | ......... C23C 18/1233 |

OTHER PUBLICATIONS

Kim, Dongwan et al., Thermal Dissipation Annealing for Cyrstallizaiton of In-Doped ZnO Films Deposited on Polyethylene Naphthalate Substrate without Substrate Deformaiton. Physica Status solidi(a). vol. 218, No. 16, Feb. 17, 2021, p. 1-13 (Year: 2021).*
(Continued)

*Primary Examiner* — Aiden Lee
(74) *Attorney, Agent, or Firm* — Sughrue Mion, PLLC

(57)                    ABSTRACT

The present invention relates to a method for crystallization of a metal oxide thin film by using thermal dissipation annealing (TDA) and exhibits an effect enabling high-temperature thermal annealing, which is essential for the performance improvement of a semiconductor material, a sensor material, and the like deposited on a thin-plate substrate, even without degrading the performance of the thin-plate substrate. In addition, a metal oxide thin film
(Continued)

prepared by the method of the present invention is in the form of a two-dimensional nanosheet, and thus may have a low defect density (high crystallinity) and a wide surface area. Accordingly, based on the improved photosensitivity and photoreactivity, the metal oxide thin film may be utilized in a high-performance photoelectric device.

8 Claims, 13 Drawing Sheets

(51) Int. Cl.
*H01L 21/324* (2006.01)
*H01L 21/67* (2006.01)
(52) U.S. Cl.
CPC ...... *C23C 18/1233* (2013.01); *C23C 18/1245* (2013.01); *C23C 18/1254* (2013.01); *H01L 21/324* (2013.01); *H01L 21/67098* (2013.01)
(58) Field of Classification Search
CPC .......... C23C 16/463; C23C 16/46–488; H01L 21/02; H01L 21/67; H01L 21/324; H01L 21/67098; Y02P 70/50
See application file for complete search history.

(56) References Cited

OTHER PUBLICATIONS

Dongwan Kim et al., "Thermal Dissipation Annealing for Crystallization of In-Doped ZnO Films Deposited on Polyethylene Naphthalate Substrate without Substrate Deformation", Physica status solidi(a), 2021, pp. 1-13, vol. 218, No. 16.
Dongwan Kim et al., "Transparent and flexible ZnO nanorods induced by thermal dissipation annealing without polymer substrate deformation for next-generation wearable devices", RSC Advances, 2021, pp. 17538-17546, No. 29.
Dongwan Kim et al., "Crystallization of ZnO thin films without polymer substrate deformation via thermal dissipation annealing method for next generation wearable devices", RSC Advances, 2021, pp. 876-882, No. 2.
Dongwan Kim et al., "Crystallization of ZnO thin films via thermal dissipation annealing method for high-performance UV photodetector with ultrahigh response speed", scientific reports, 2021, vol. 11, Article No. 382, pp. 1-10.
International Search Report of PCT/KR2022/009339 dated Oct. 27, 2022 [PCT/ISA/210].

\* cited by examiner

<FIG. 1>
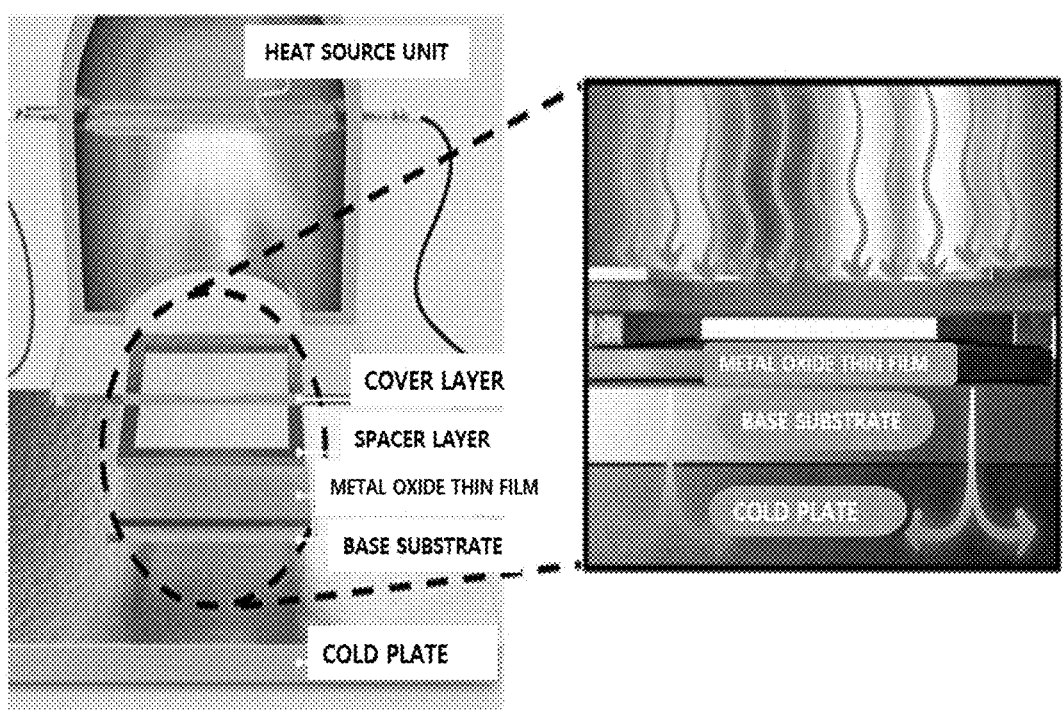
<FIG. 2>
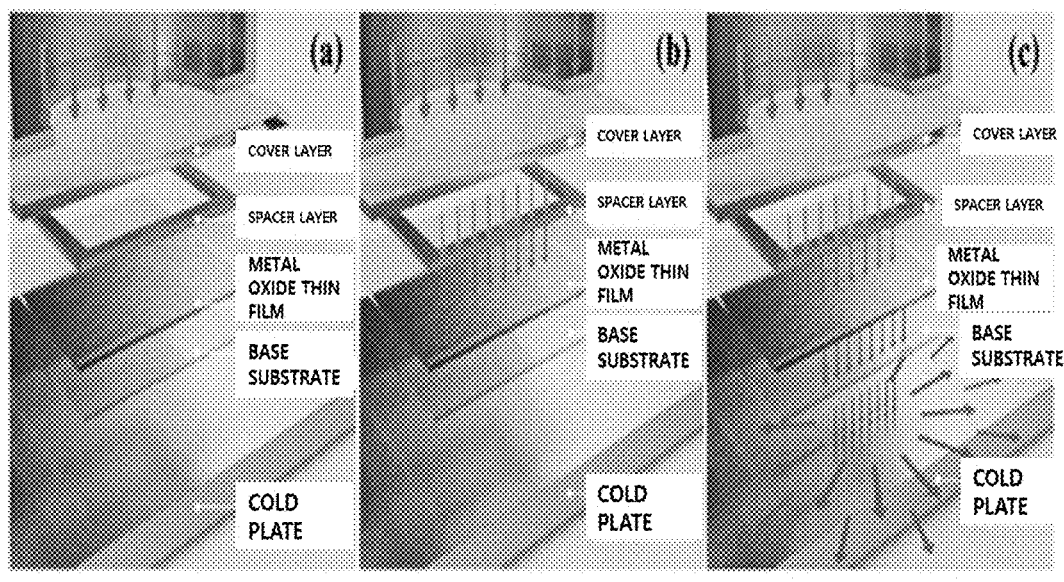

<FIG. 3>
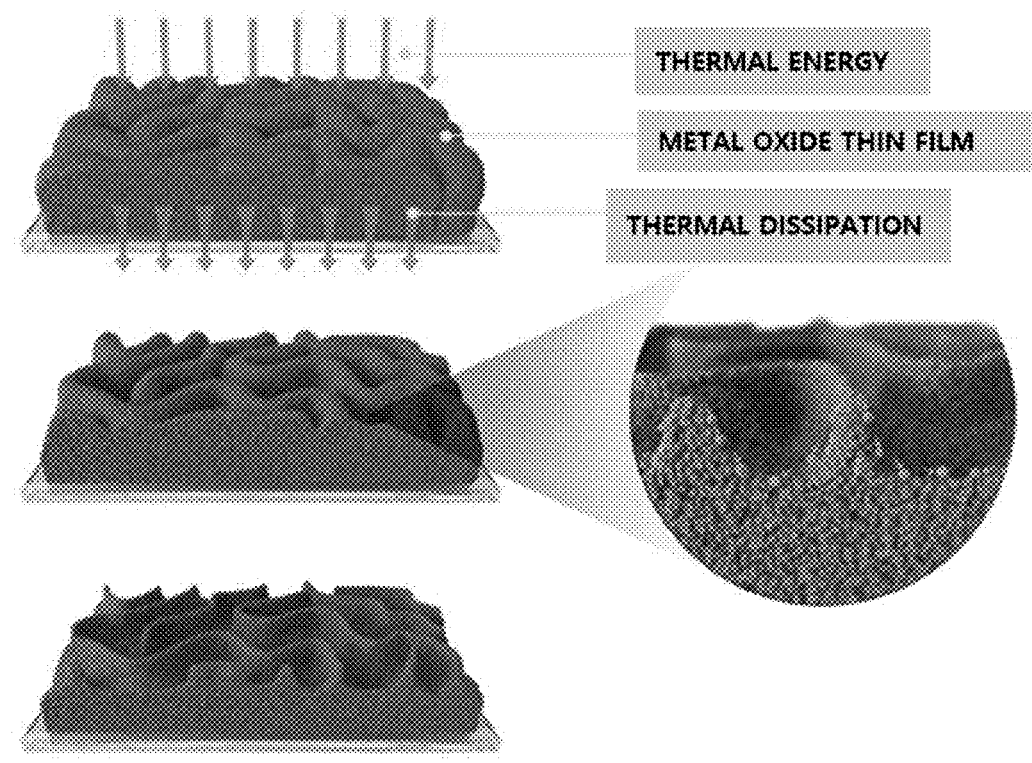
<FIG. 4>
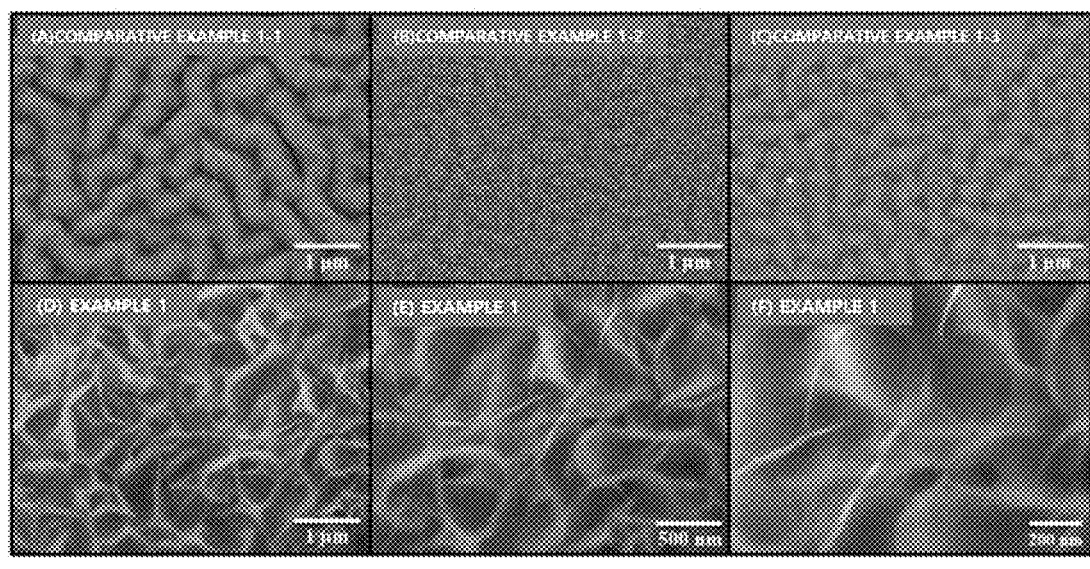

<FIG. 5>
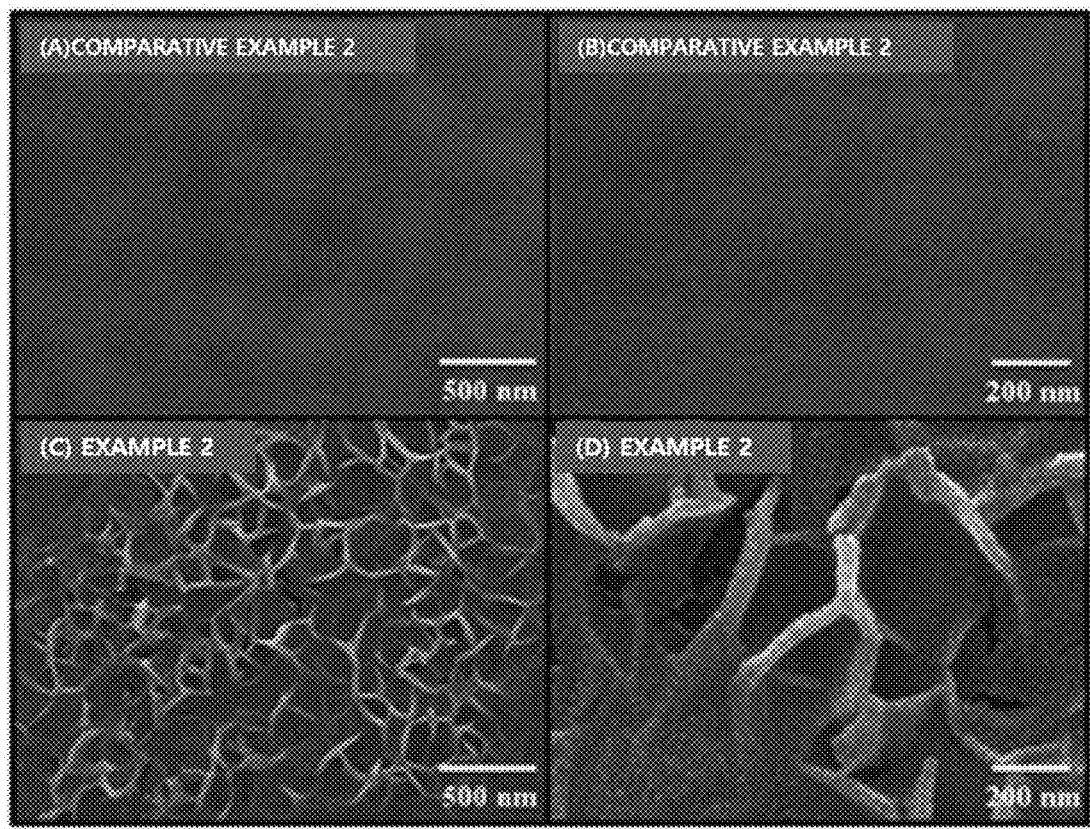
<FIG. 6>
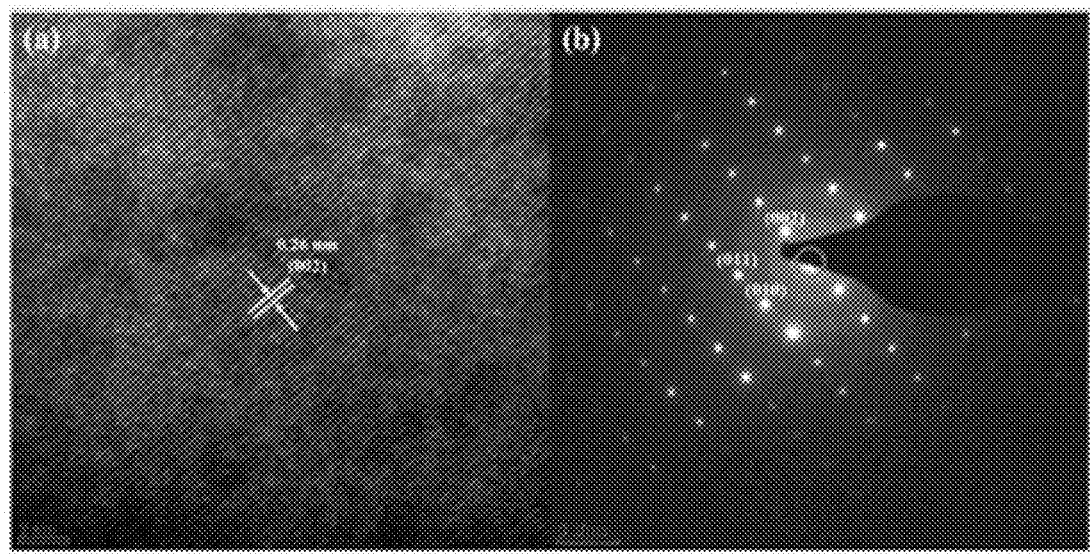

<FIG. 7>
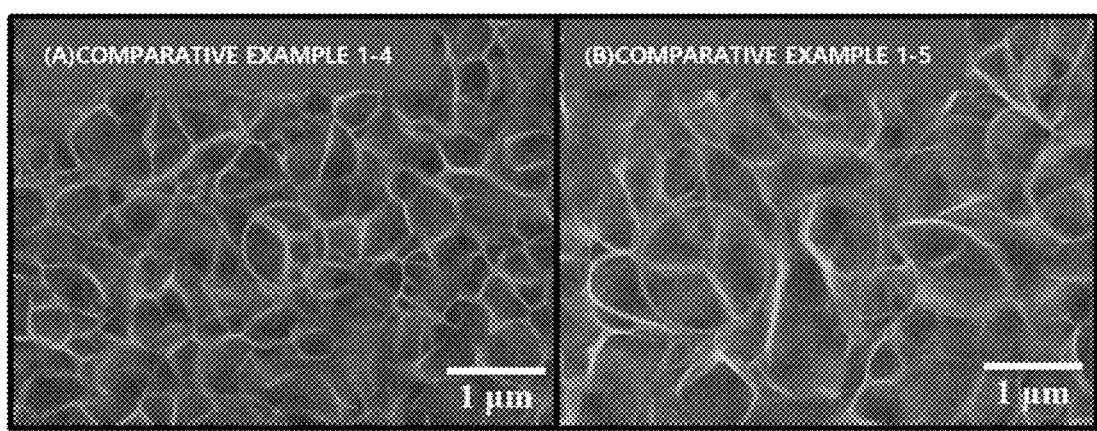
<FIG. 8>
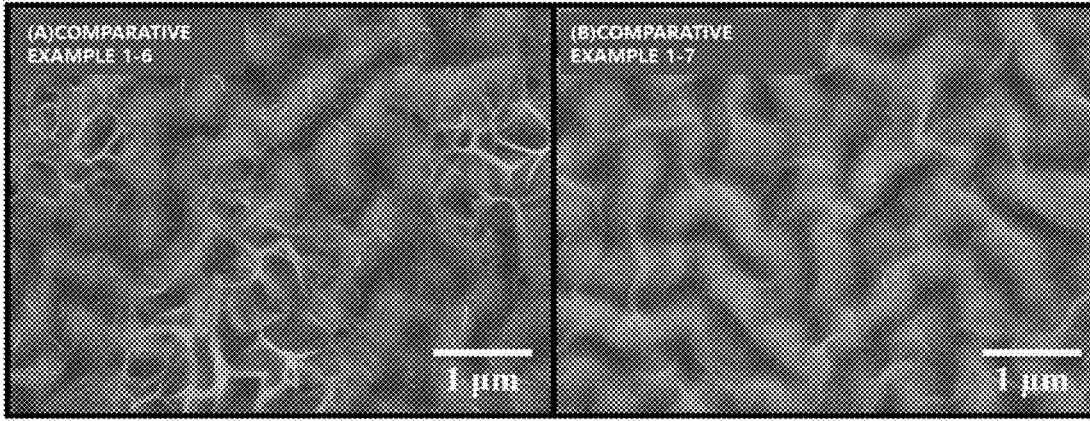

<FIG. 9>
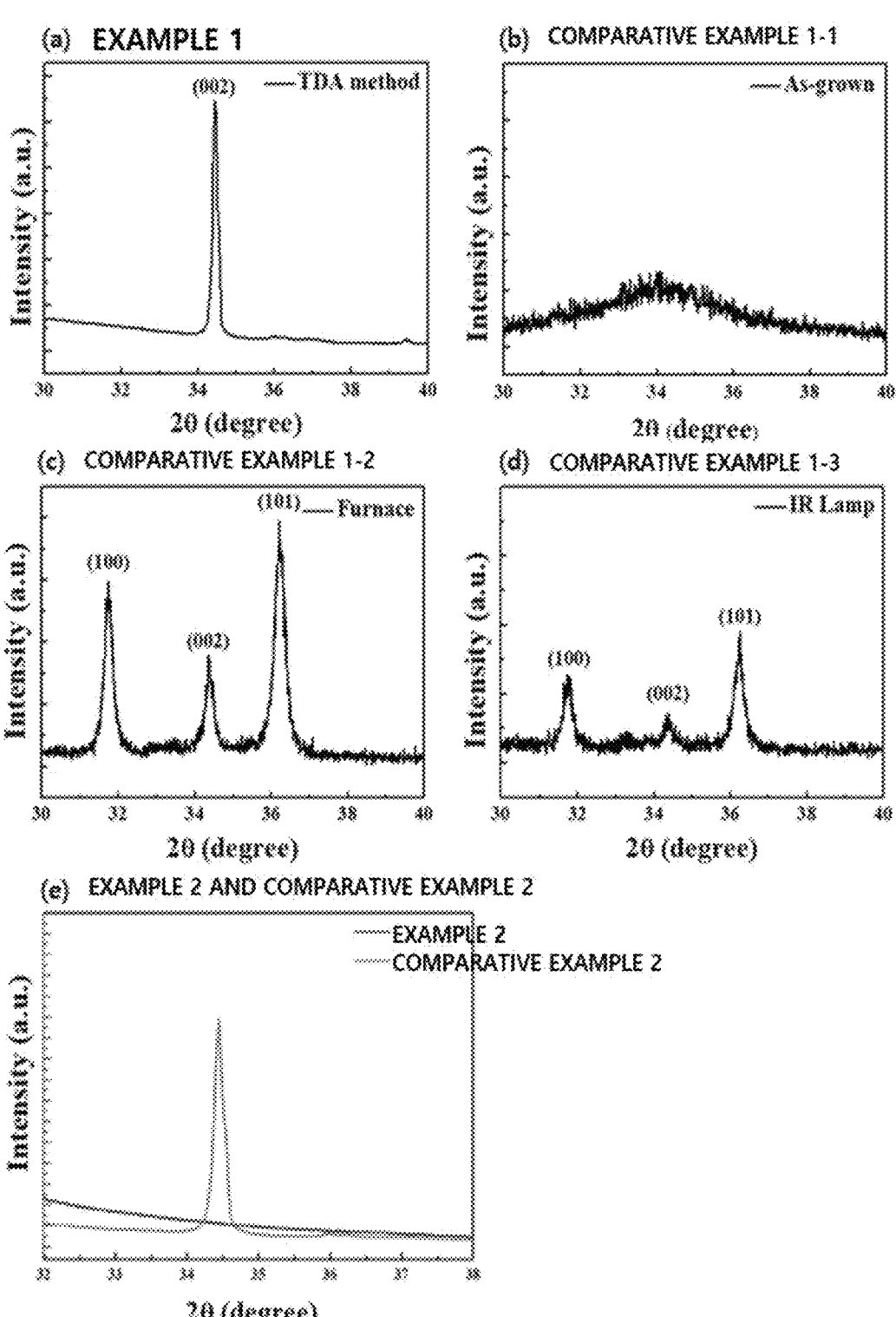

<FIG. 10>
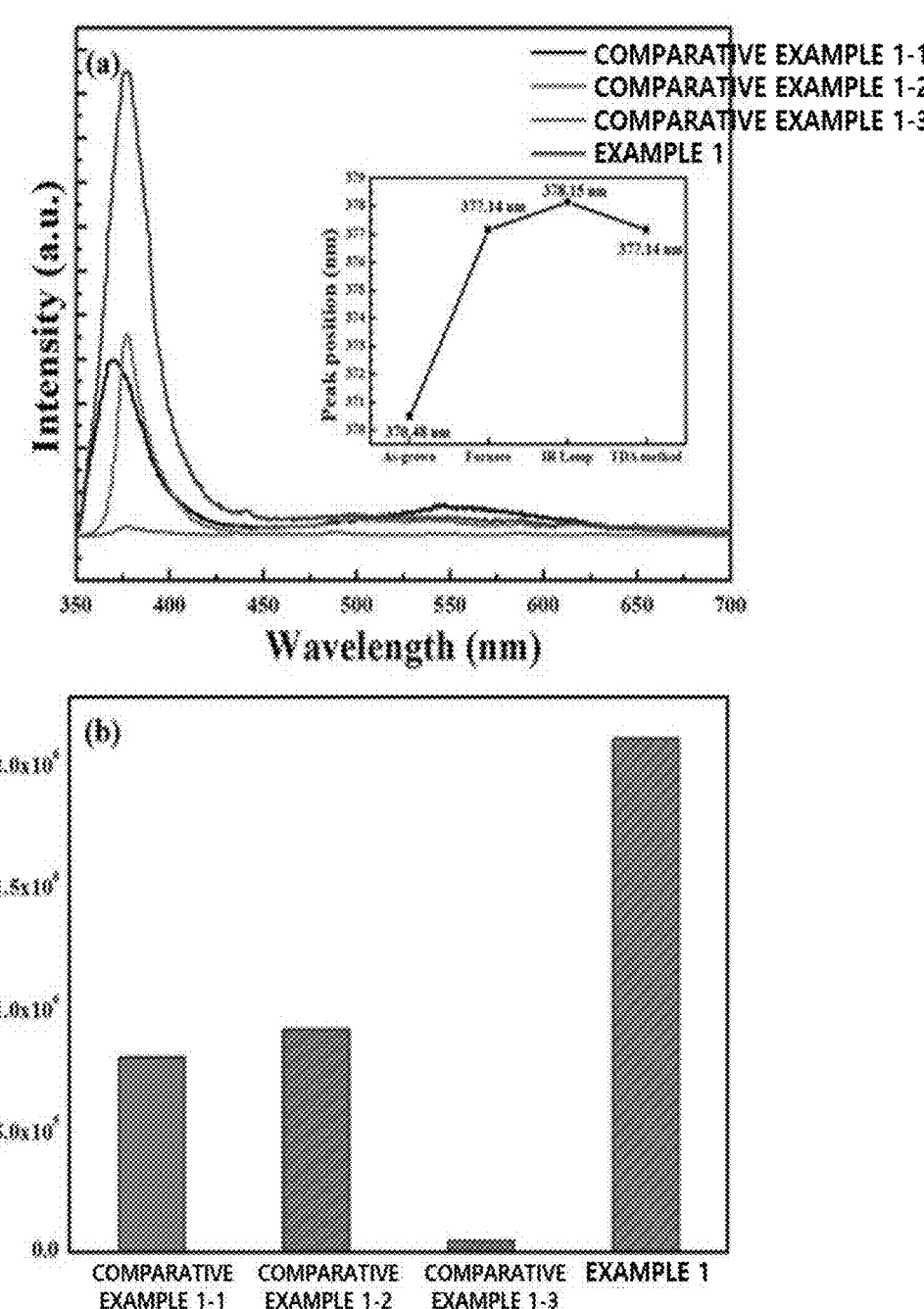

FIG. 12
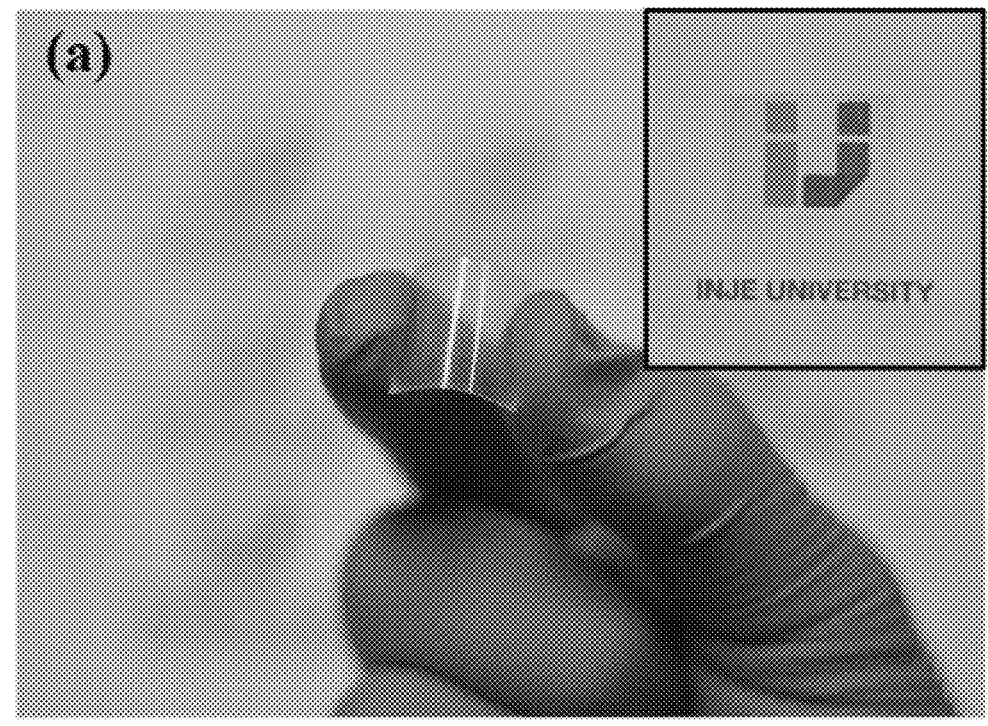
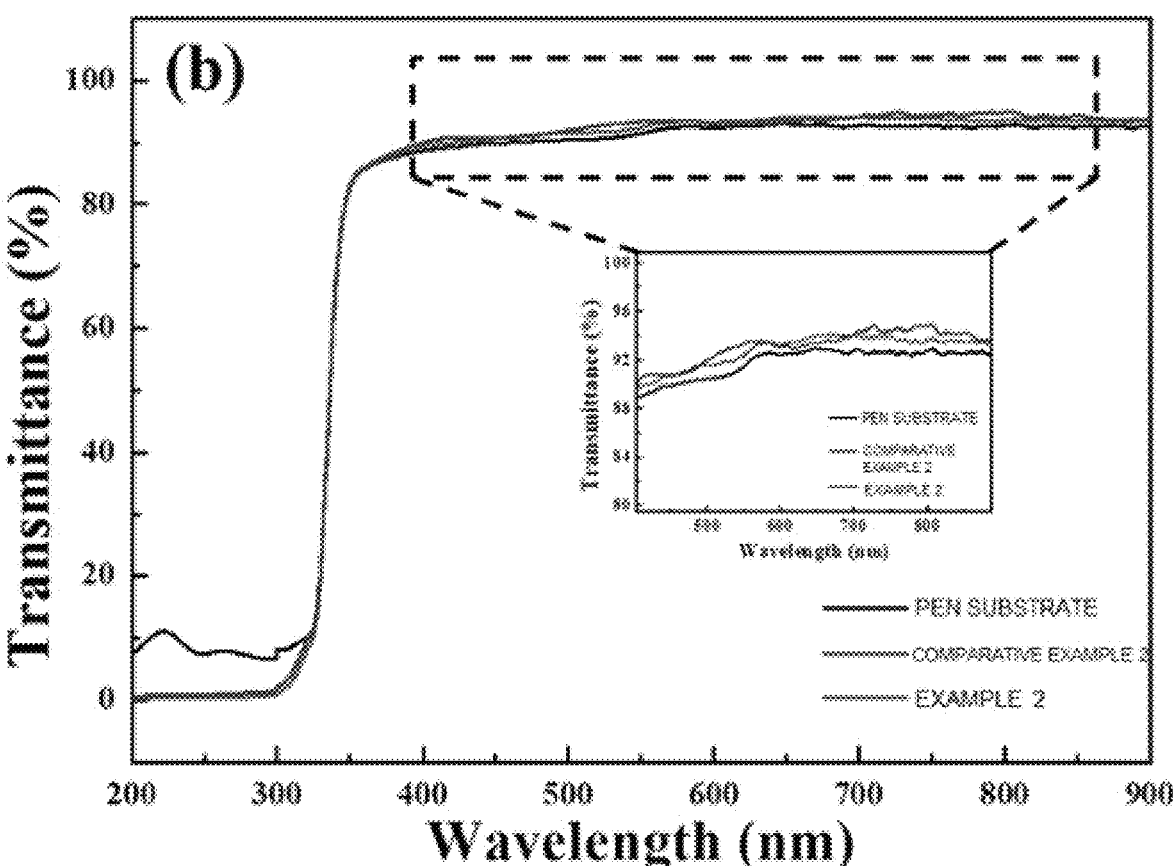

FIG. 13
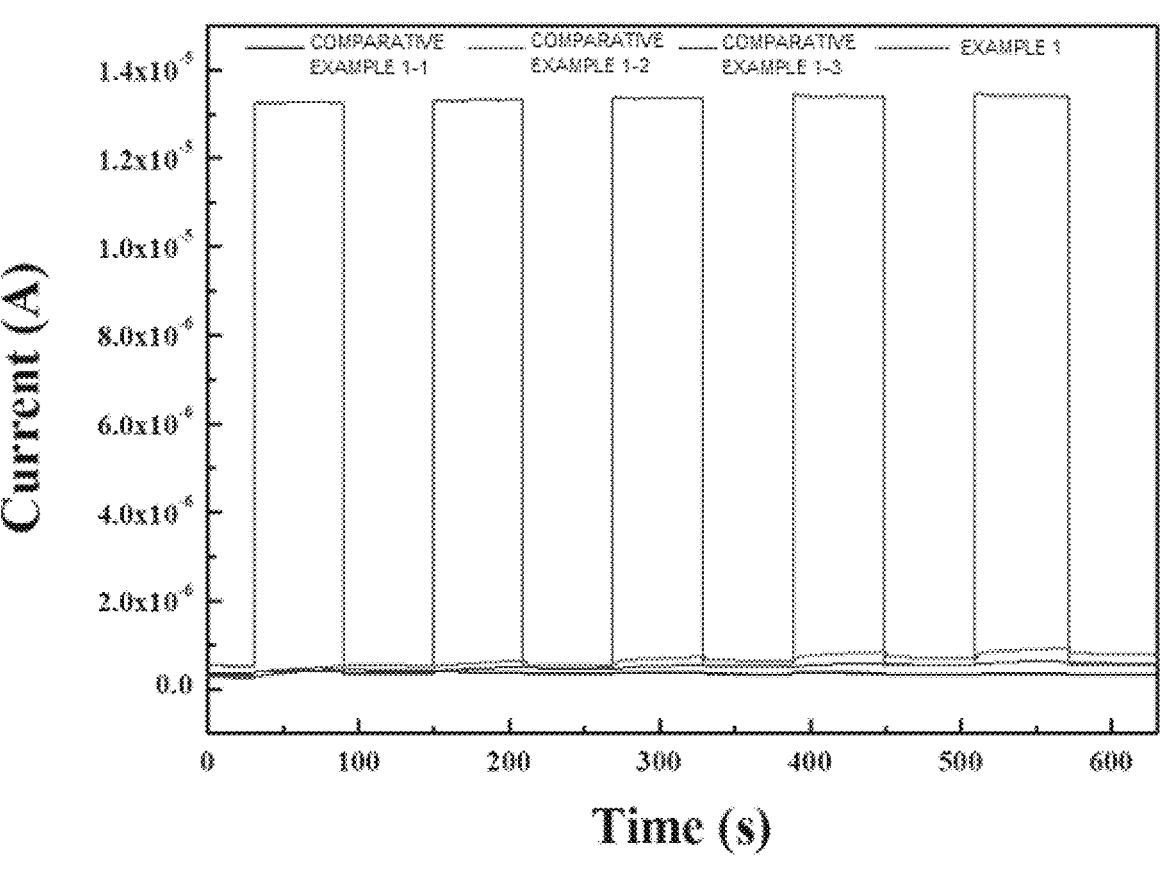
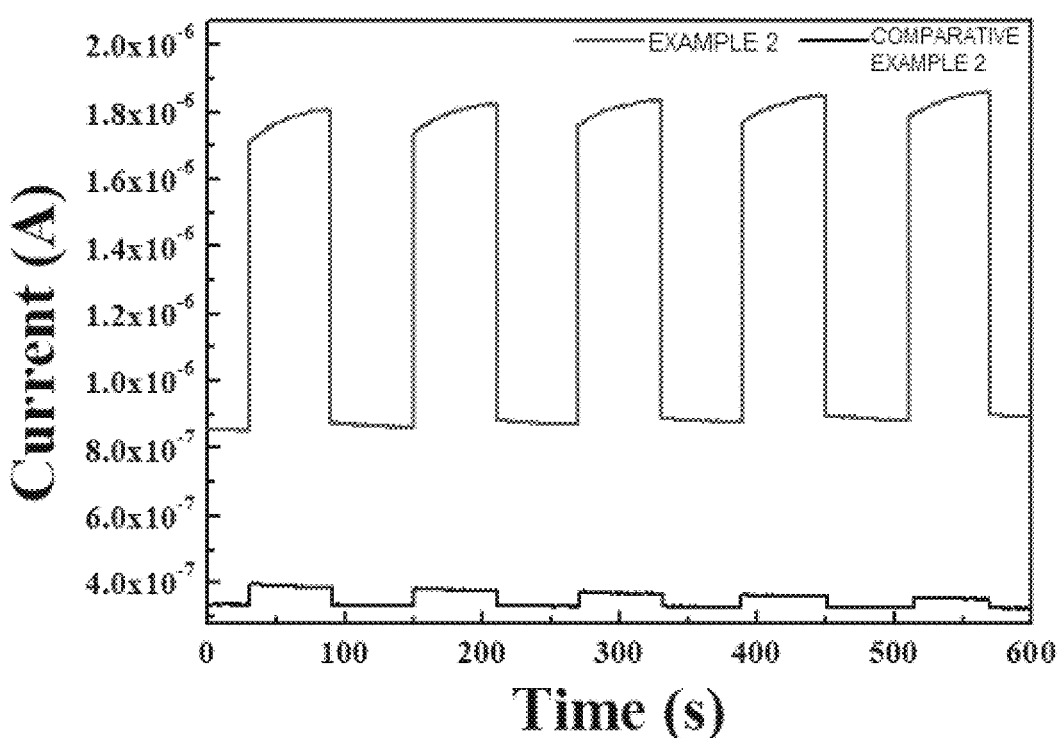

<FIG. 14>

METHOD FOR CRYSTALLIZATION OF METAL OXIDE THIN FILM BY USING THERMAL DISSIPATION ANNEALING

CROSS REFERENCE TO RELATED APPLICATIONS

This application is a National Stage of International Application No. PCT/KR2022/009339 filed on Jun. 29, 2022, claiming priority based on Korean Patent Application No. 10-2021-0120838 filed on Sep. 10, 2021, the entire disclosures of which are incorporated herein by reference.

TECHNICAL FIELD

The present invention relates to a method for crystallization of a metal oxide thin film by using thermal dissipation annealing (TDA), and more particularly, to a method for crystallization of a metal oxide thin film by using a thermal dissipation annealing (TDA) method and a thermal dissipation annealing (TDA) apparatus used thereto capable of performing high-temperature thermal annealing of the metal oxide thin film while injecting thermal energy into the metal oxide thin film and removing the latent heat of the substrate without damaging the substrate.

BACKGROUND ART

Transparent TVs, transparent mobile phones, flexible electronic devices, transparent sensors, etc. are future electronic products that require continuous development of related technologies. In particular, the main focus of related industries for mass production is the development of new and innovative technologies with scalability in terms of economic feasibility, stability, and mass production.

Currently, transparent, or flexible electronic devices have been largely developed around the world based on thin-plate glass, thin-plate polymer substrates, and thin-plate metal substrates.

In order to improve the performance of the above-mentioned transparent or flexible electronic devices, a thermal annealing process is essential, and a high-temperature thermal annealing process of 500° C. or higher is usually required during a manufacturing process. In order to avoid the high-temperature thermal annealing process, technologies for thermal annealing at a low temperature of 400° C. or lower for a relatively long time have been developed, but there are disadvantages in that there is a difficulty in mass production and the consumption of time and cost is high.

In terms of savings in mass production process time and activation energy efficiency of desired materials, a high-temperature rapid thermal annealing (RTA) technology using the minimum possible time at a high temperature is a technology easily accessible in the market enough to be widely used in a diffusion process of silicon-based semiconductor impurities, post-ion implantation process, etc.

For example, the RTA technology for silicon semiconductor devices includes processes of rapid thermal annealing under a condition of about 1,000° C. or higher and then cooling. At this time, the RTA technology uses a method for removing heat by disposing a plurality of high-temperature halogen lamps generally as a heat source for supplying heat around the outside of a furnace into which a substrate is inserted and also disposing nitrogen gas or liquid solvent pipes around the furnace for rapid cooling after thermal annealing.

The high-temperature RTA technologies may also be used for thermal annealing of transparent or flexible electronic devices. To date, as the thermal annealing method for the transparent or flexible electronic devices, i) a method using a conventional electric resistance heater, ii) a rapid thermal annealing method using a halogen lamp, iii) a thermal annealing method by irradiating a laser, or the like has mainly been developed.

Meanwhile, recent UV photodetectors have shown great potential and commercial effect in various fields such as secure space communications, pollution monitoring, water disinfection, flame, fire, cosmetic health sensors, and missile smoke detection applications.

The UV photodetector has been studied based on various semiconductors such as Si, ZnS or ZnO. The Si-based UV photodetector shows a fast response speed but has disadvantages of requiring a complex filter to prevent noise associated with low power and requiring ultra-high vacuum and high voltage for accurate detection by the UV photodetector. The ZnS-based UV photodetector does not require a complex filter like the Si-based UV photodetector due to a wide band gap (3.91 eV) of ZnS but has disadvantages of having a weak photocurrent value and poor stability and responding only to UV light with a wavelength shorter than 335 nm.

On the other hand, ZnO is a suitable material for use in transparent and flexible UV photodetectors due to a wide bandgap (3.37 eV), large exciton binding energy (60 meV), high electron mobility in a visible region, and high transparency.

Conventionally, in order to manufacture the ZnO-based UV photodetector, various deposition methods such as metal-organic chemical vapor deposition, molecular beam epitaxy (MBE), pulsed laser deposition, a sol-gel spin coating method, and a hydrothermal method have been used. Among the methods, ZnO thin film deposition using the sol-gel spin coating method has various advantages such as simplicity, easy control of doping concentrations, simple solution concentrations, generation of a homogeneous thin film, and large-area production without using expensive and complex equipment required by other methods.

However, despite these advantages, when an amorphous ZnO thin film is deposited using the sol-gel spin coating method, the ZnO thin film becomes amorphous, and the amorphous ZnO thin film has a disadvantage of deteriorating the performance of transparent and flexible photoelectric device due to a high grain boundary ratio.

Accordingly, the sol-gel spin-coated ZnO thin film needs to be crystallized to improve the performance of ZnO-based transparent and flexible photoelectric devices, and many researchers have attempted for a long time to effectively anneal the sol-gel spin-coated ZnO thin film.

The most common annealing method for crystallization of the sol-gel spin-coated ZnO thin film is thermal annealing in a furnace. However, the thermal annealing through the furnace is performed at a high temperature (500° C. or higher) and has a disadvantage of causing lattice mismatch due to a difference in thermal expansion coefficient between the ZnO thin film and the substrate. In the case of using the laser annealing method, the crystallinity of the ZnO thin film is improved compared to the ZnO thin film thermally annealed using the furnace, but the transparency of the ZnO thin film decreases due to an increase in grain boundary density and an increase in scattered photons. In addition, a rapid thermal annealing process is required to completely crystallize the amorphous ZnO thin film before the laser annealing method, and the additional annealing process has a problem of increasing the number of oxygen vacancies that degrade the performance of ZnO-based optoelectronics.

Furthermore, the ZnO-based transparent and flexible electronic devices should be deposited on a transparent and flexible polymer substrate that exhibits high transparency in a visible region.

For example, a polymer substrate such as polyethylene terephthalate (PET) and polyethylene naphthalate (PEN) cannot be annealed at a high temperature (500° C. or higher) due to a low glass transition temperature (130° C.) and a melting point (200° C.), and annealing methods using electron beams and excimer lasers are also not suitable because the high energy density of the excimer laser and electron beams deforms the polymer substrate.

Therefore, in order to manufacture transparent and flexible photoelectric devices, such as high-performance UV photodetectors, using polymer substrates, a new annealing method needs to be developed for the crystallization of the sol-gel spin-coated ZnO thin film that may completely crystallize the amorphous state of the ZnO thin film with a low defect density without melting or deforming the substrate.

PRIOR ARTS

Patent Documents

Korean Patent Registration No. 10-0845944

DISCLOSURE

Technical Problem

One object of the present invention is to provide a method for crystallization of a metal oxide thin film by using thermal dissipation annealing (TDA), including depositing a metal oxide thin film on the upper surface of a base substrate (Step 1); positioning and cooling a lower surface of the base substrate on which the metal oxide thin film prepared in Step 1 is deposited on the upper surface of a cold plate (Step 2); and annealing the metal oxide thin film while maintaining the cooling of the cold plate (Step 3).

Another object of the present invention is to provide a thermal dissipation annealing (TDA) apparatus including a cold plate for cooling a base substrate; the base substrate positioned on the cold plate; a metal oxide thin film deposited on the base substrate; and a heat source unit for annealing the metal oxide thin film.

Yet another object of the present invention is to provide a metal oxide thin film crystallized by using the crystallization method.

Yet another object of the present invention is to provide an electronic device including the metal oxide thin film.

Technical Solution

In order to achieve the above objects, one aspect of the present invention provides a method for crystallization of a metal oxide thin film by using thermal dissipation annealing (TDA), including depositing a metal oxide thin film on the upper surface of a base substrate (Step 1); positioning and cooling a lower surface of the base substrate on which the metal oxide thin film prepared in Step 1 is deposited on the upper surface of a cold plate (Step 2); and annealing the metal oxide thin film while maintaining the cooling of the cold plate (Step 3).

Another aspect of the present invention provides a thermal dissipation annealing (TDA) apparatus including a cold plate for cooling a base substrate; the base substrate positioned on the cold plate; a metal oxide thin film deposited on the base substrate; and a heat source unit for annealing the metal oxide thin film.

Yet another aspect of the present invention provides a metal oxide thin film crystallized by using the crystallization method.

Yet another aspect of the present invention provides an electronic device including the metal oxide thin film.

Advantageous Effects

According to a method for crystallization of the metal oxide thin film by using the thermal dissipation annealing of the present invention, it is possible to efficiently thermally anneal a polymer substrate, a glass substrate, a thin-plate substrate, etc., which hardly maintain the performance of a thin film due to damage to the performance of a substrate material or thermal stress between the substrate and the metal oxide thin film deposited on the substrate, by a method of injecting thermal energy and simultaneously removing the latent heat of the substrate. In particular, it is possible to exhibit an effect of enabling high-temperature thermal annealing, which is essential for improving the performance of a semiconductor material, a sensor material, and the like deposited on a thin-plate substrate, even without damaging the performance of the thin-plate substrate.

Furthermore, a metal oxide thin film prepared by using the method for crystallization of the metal oxide thin film by using the thermal dissipation annealing of the present invention is in the form of a two-dimensional nanosheet, and thus may have a low defect density (high crystallinity) and a wide surface area. Accordingly, based on the improved photosensitivity and photoreactivity, the metal oxide thin film may be utilized in a high-performance photoelectric device.

It should be understood that the effects of the present invention are not limited to the effects described above but include all effects that can be deduced from the detailed description of the present invention or configurations of the invention described in claims.

DESCRIPTION OF DRAWINGS

FIGS. 4 and 5 are FE-SEM images of ZnO thin films of Example and Comparative Example of the present invention.

FIG. 6 is a HRTEM image (a) and a selected-area electron diffraction (SAED) pattern image (b) of a ZnO thin film of Example of the present invention.

FIGS. 7 and 8 are FE-SEM images of ZnO thin films of Comparative Examples of the present invention.

FIG. 9 illustrates results of XRD analysis of ZnO thin films of Example and Comparative Example of the present invention.

FIGS. 10 and 11 illustrate PL analysis results of Example and Comparative Example of the present invention.

FIG. 12 is an image (a) of a ZnO thin film of Example of the present invention and (b) results of light transmittance measurement of the ZnO thin film of Example and Comparative Example.

FIG. 13 illustrates results of measuring the photoresponse of ZnO thin films of Example and Comparative Example of the present invention.

FIG. 15-1 to 15-3 is a rise and decay graphs of a photoresponse curve for the ZnO thin films of Example and Comparative Example of the present invention.

BEST MODE FOR THE INVENTION

Hereinafter, preferred embodiments of the present invention will be described in detail with reference to the accompanying drawings. The present invention is not limited to an embodiment disclosed below but may be implemented in various different shapes and the present embodiment just completes a disclosure of the present invention and is provided to completely inform a scope of the present invention to those skilled in the art.

One aspect of the present invention provides a method for crystallization of a metal oxide thin film by using thermal dissipation annealing (TDA), including depositing a metal oxide thin film on the upper surface of a base substrate (Step 1); positioning and cooling a lower surface of the base substrate on which the metal oxide thin film prepared in Step 1 is deposited on the upper surface of a cold plate (Step 2); and annealing the metal oxide thin film while maintaining the cooling of the cold plate (Step 3).

Figure 1:
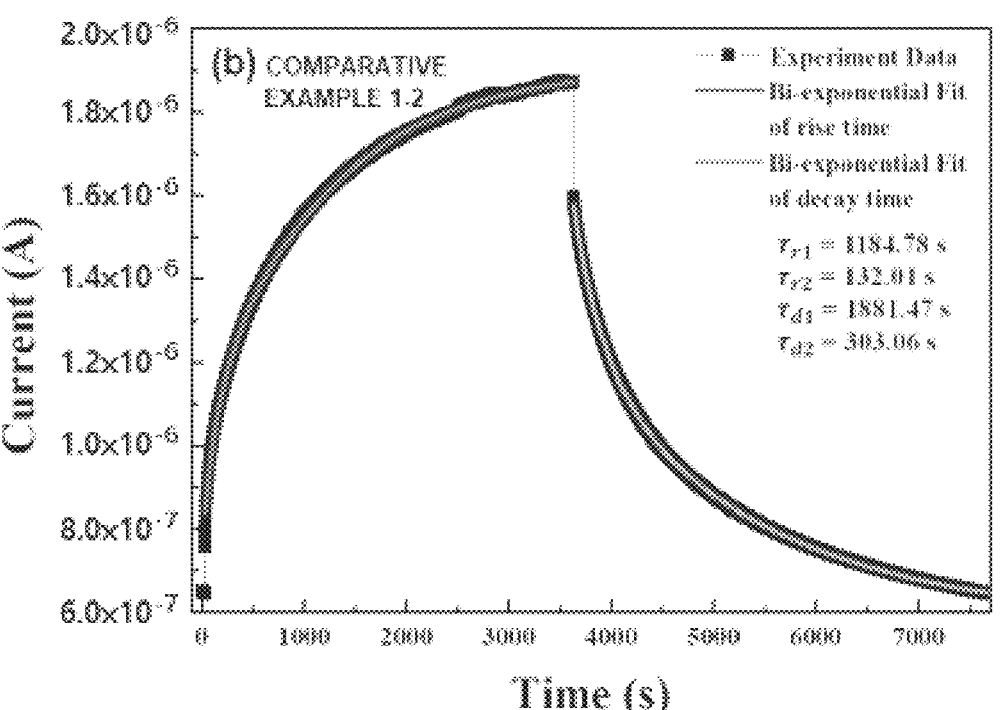
FIG. 1 is a schematic diagram of a thermal dissipation annealing (TDA) apparatus of the present invention.
Figure 15:
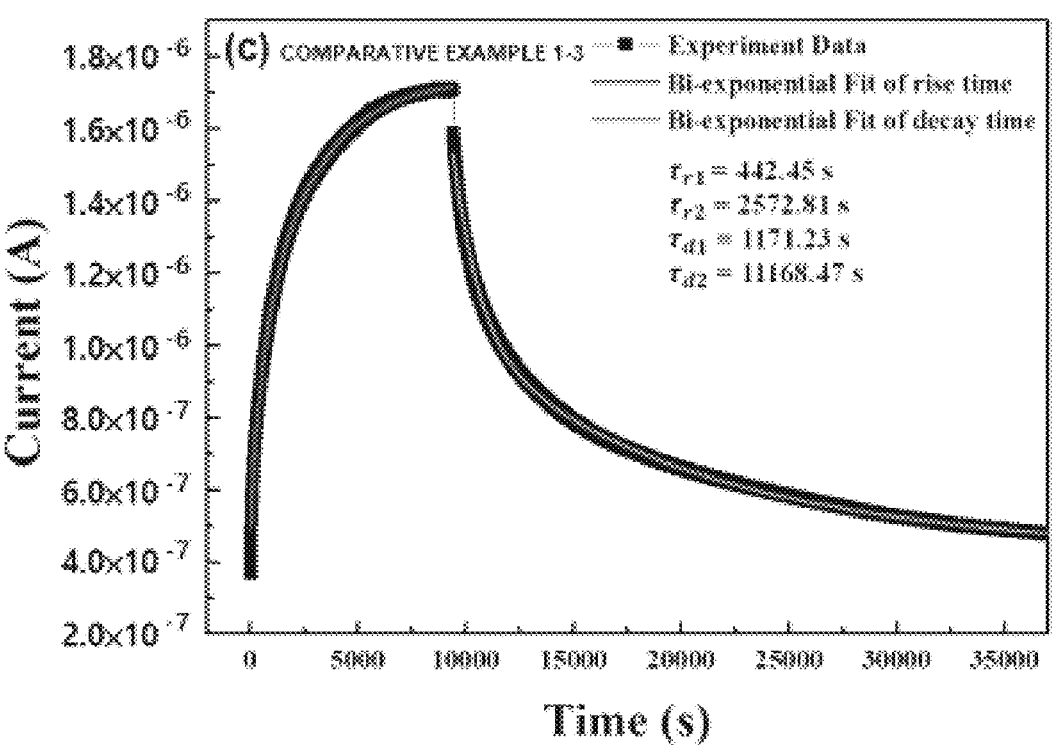

FIG. 1 is a schematic diagram of a thermal dissipation annealing (TDA) apparatus of the present invention.

Referring to FIG. 1, a thermal dissipation annealing (TDA) apparatus of the present invention includes a cold plate for cooling a base substrate; the base substrate positioned on the cold plate; a metal oxide thin film deposited on the base substrate; and a heat source unit for annealing the metal oxide thin film.

In an embodiment of the present invention, the method for crystallization of the metal oxide thin film by using the TDA may be performed by using the TDA apparatus including the cold plate of an aspect of the present invention illustrated in FIG. 1 above, and the TDA apparatus and the method for crystallization of the metal oxide thin film by using the TDA will be described at the same time.

First, the method for crystallization of the metal oxide thin film of the present invention includes a step of depositing a metal oxide thin film on the upper surface of a base substrate (Step 1).

In an embodiment of the present invention, the base substrate is made of any material on which the metal oxide thin film may be deposited without limitation and the material may be appropriately selected according to a type of electronic device to be manufactured. For example, the base substrate may be one type selected from the group consisting of a polymer substrate, a glass substrate, a metal substrate, a ceramic substrate, and a semiconductor substrate, for example, a glass substrate or a polymer substrate.

In an embodiment of the present invention, when the feature of the electronic device to be manufactured is a flexible and/or transparent electronic device, the base substrate may be a polymer substrate. At this time, the polymer substrate may be one selected from the group consisting of polyimide (PI), polycarbonate (PC), polyethylene naphthalate (PEN), polyethylene terephthalate (PET), and polyethersulfone (PES), for example, polyethylene naphthalate (PEN), but is not limited thereto.

In the related art, when attempting to manufacture the flexible and/or transparent electronic device, there was difficulty in using the polymer substrate because a high-temperature annealing process was impossible, and damage was easy due to the low glass transition temperature and melting point of the polymer substrate material.

The method for crystallization of the metal oxide thin film of the present invention is not limited to the material of the base substrate and has an effect of enabling a high-temperature annealing process even while preventing the damage to the substrate and improving the performance of the electronic device to be finally manufactured.

In an embodiment of the present invention, the metal oxide thin film may also be appropriately selected depending on a type of electronic device to be manufactured, like the base substrate described above. For example, the metal oxide thin film may include at least one selected from the group consisting of tin oxide (SnO), indium oxide ($In_2O_3$), zinc indium oxide (ZIO), indium galluim oxide (IGO), zinc tin oxide (ZTO), indium gallium zinc oxide (IGZO), copper oxide (CuO), cadmium oxide (CdO), aluminum oxide ($Al_2O_3$), tungsten oxide ($W_2O_3$), titanium oxide ($TiO_2$) and zinc oxide (ZnO).

In an embodiment of the present invention, when the electronic device to be manufactured is a photoelectric device, in a specific embodiment, a UV photodetector, the metal oxide thin film may be zinc oxide (ZnO) or titanium oxide ($TiO_2$). In an embodiment of the present invention, Step 1 may be performed by a method selected from the group consisting of a sol-gel coating method, metal-organic chemical vapor deposition, physical vapor deposition, molecular beam epitaxy, a hydrothermal method, and pulse laser deposition, for example, a sol-gel coating method, but is not limited thereto.

The sol-gel coating method is a coating method of preparing a metal oxide precursor solution and using the metal oxide precursor solution, and has various advantages of simplicity, easy control of a doping level, a simple solution concentration, generation of a homogeneous thin film, and large-area production without using expensive and complicated equipment required in other methods described above. On the other hand, when manufacturing the base substrate on which the metal oxide thin film is deposited using the sol-gel coating method, there is a disadvantage that in order to crystallize an amorphous metal oxide thin film, a high-temperature annealing process is essentially required, and the high-temperature annealing process is not easy.

The method for crystallization of the metal oxide thin film by using the TDA of the present invention has an advantage of being able to mass-produce a homogeneous metal oxide thin film in an economical and simple method by using the advantages of the sol-gel coating method, because the high-temperature annealing process of the metal oxide thin film deposited on the base substrate using the above-described sol-gel coating method is easy.

In an embodiment of the present invention, when Step 1 is performed using the sol-gel coating method, the metal oxide precursor solution may be deposited on the base substrate by using nozzle flow coating, spray coating, deep coating, roll coating or spin coating, for example, spin coating, but is not limited thereto.

Next, the method for crystallization of the metal oxide thin film of the present invention includes positioning and cooling the lower surface of the base substrate on which the metal oxide thin film prepared in Step 1 is deposited on the upper surface of the cold plate (Step 2); and annealing the metal oxide thin film while maintaining the cooling of the cold plate (Step 3).

Figure 2:
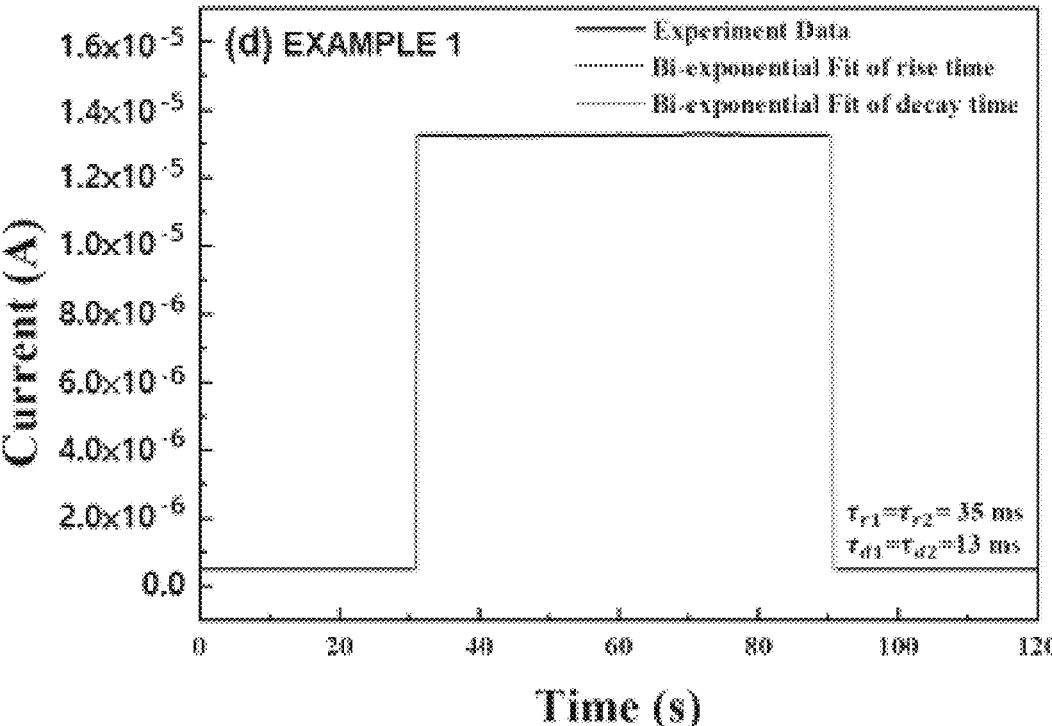
FIG. 2 is a schematic diagram describing an annealing process of a thermal dissipation annealing (TDA) apparatus of the present invention.
Figure 15:
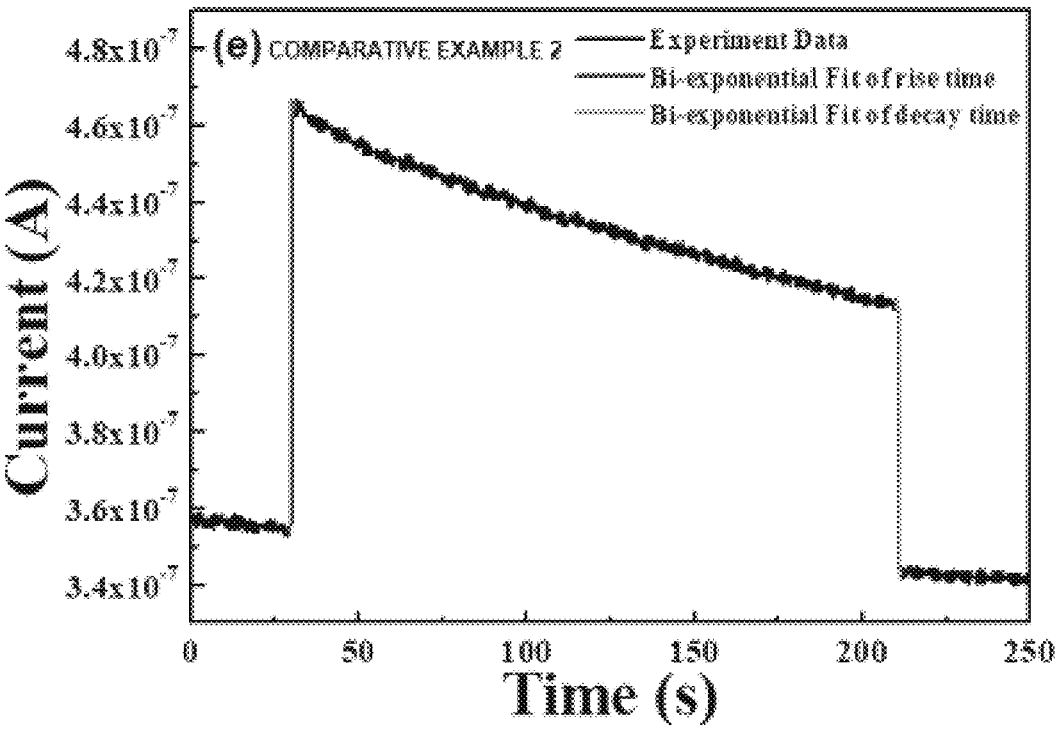

FIG. 2 is a schematic diagram describing an annealing process in a method for crystallization of a metal oxide using thermal dissipation annealing (TDA) of the present invention.

Referring to FIG. 2, the annealing process of the method for crystallization of the metal oxide using TDA of the present invention may be performed by 3 STEP of generation of thermal energy (a), absorption of thermal energy (b), and release of thermal energy (c).

When describing 3 STEP of the annealing process in detail, i) first, when thermal energy is generated in the heat source unit of the TDA apparatus of the present invention, the thermal energy passes through the covering layer and then reaches the surface of the metal oxide thin film, ii) a portion of the thermal energy reaching the surface of the metal oxide thin film is absorbed in the metal oxide thin film and used for crystallization of the amorphous metal oxide thin film, and the thermal energy that is not absorbed reaches the base substrate on which the metal oxide thin film is deposited, and iii) the thermal energy that reaches the base substrate is not absorbed in the base substrate, but dissipates as it is due to the cool air of the cold plate.

In the above-described annealing process, the thermal energy that reaches the base substrate due to the cold plate dissipates as it is in the base substrate to enable the crystallization of the metal oxide thin film without damage such as deformation or melting of the base substrate, even when high-temperature thermal energy is transmitted from the heat source unit.

In an embodiment of the present invention, for the dissipation of the thermal energy described above, in Step 2 of the crystallization method of the present invention, the temperature and time of the cooling step may be factors affecting the crystallization of the metal oxide thin film to be crystallized.

In a specific embodiment, when the metal oxide thin film contains zinc oxide (ZnO), that is, in the case of the ZnO thin film, Step 2 may be performed by setting the cold plate to $-15°$ C. to $-5°$ C., for example, $-11°$ C. to $-9°$ C., for example, $-10°$ C., positioning the lower surface of the base substrate on which the ZnO thin film is deposited on the upper surface of the cold plate, and maintaining the cooling process for 10 seconds to 1 minute, for example, 20 seconds to 40 seconds, for example, 29 seconds to 31 seconds, for example, 30 seconds.

At this time, when the temperature and cooling time of the cold plate are out of the above-mentioned range, for example, i) when the cold plate is maintained at a temperature greater than $0°$ C., for example, greater than $-5°$ C., for example, greater than $-9°$ C., for example, greater than $-10°$ C., for less than 10 seconds, for example, less than seconds, for example, less than 30 seconds, or ii) when the cold plate is maintained at a temperature less than $-15°$ C., for example, less than $-11°$ C., for example, less than $-10°$ C., for greater than 1 minute, for example, greater than 40 seconds, for example, greater than 31 seconds, for example, greater than 30 seconds, the ZnO thin film is not properly crystallized or the heat passing through the ZnO thin film is not dissipated to cause damage to the substrate.

Figure 3:
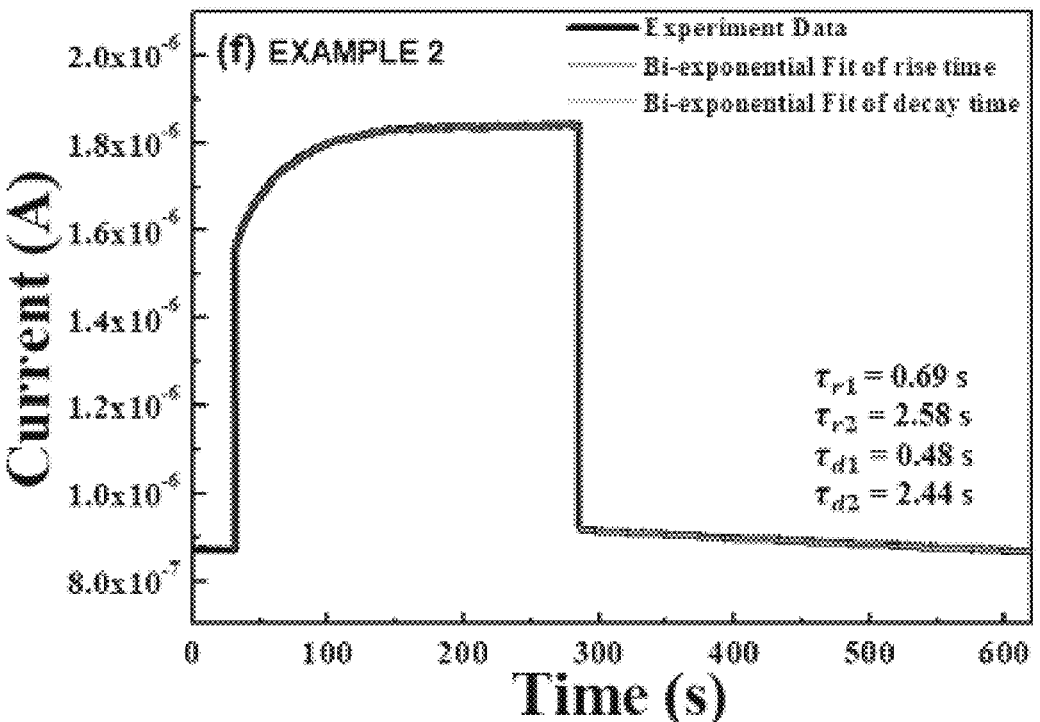
FIG. 3 is a schematic diagram describing the movement of metal oxide particles in an annealing process of a thermal dissipation annealing (TDA) apparatus of the present invention.

FIG. 3 is a schematic diagram illustrating the movement of metal oxide particles during the annealing process of the method for crystallization of the metal oxide thin film using thermal dissipation annealing (TDA) of the present invention. In the annealing process in the method for crystallization of the metal oxide thin film using TDA of the present invention, when the thermal energy is transferred from the heat source unit to the surface of the metal oxide thin film, a temperature difference is generated between the surface and the bottom of the metal oxide thin film, so that a difference in mobility of metal oxide particles located on the surface and the bottom of the metal oxide thin film may be generated.

Referring to FIG. 3, when describing the movement of the metal oxide particles of the metal oxide thin film, the metal oxide particles on the bottom of the metal oxide thin film to be annealed are kept in a low-temperature state by the cold plate of the TDA apparatus of the present invention, and the metal oxide particles on the surface of the metal oxide thin film start to absorb the thermal energy transmitted from the heat source unit to generate a temperature difference.

As the annealing process progresses, the difference in temperature between the surface and the bottom of the metal oxide thin film increases, and at this time, the difference in mobility of the metal oxide particles on the surface and the bottom of the metal oxide thin film increases.

As a result, the metal oxide particles on the surface of the metal oxide thin film move to the bottom by increased mobility due to a large amount of thermal energy and high temperature to reach a thermal equilibrium state. On the other hand, the metal oxide particles on the bottom of the metal oxide thin film do not move to the surface by reduced mobility due to a small amount of thermal energy and low temperature.

As a result, in the annealing process using the TDA apparatus of the present invention, the continuous supply of thermal energy and thermal dissipation in the base substrate continuously cause differences in mobility of the metal oxide particles and may improve the crystallinity of the metal oxide thin film.

In an embodiment of the present invention, the shape of the metal oxide thin film to be crystallized by annealing may be controlled according to the difference in temperature between the surface and the bottom of the metal oxide thin film and the difference in mobility of metal oxide particles located on the surface and the bottom.

In an embodiment of the present invention, the shape of the thin film formed in the method for crystallization of the metal oxide thin film by using thermal dissipation annealing (TDA) may be in the form of a two-dimensional nanosheet.

Conventionally, when the annealing process is performed to crystallize a metal oxide thin film, it can be confirmed that the size of nanoparticles increases and crystallizes due to Ostwald ripening, but like the present invention, a shape change due to movement of metal oxide particles cannot be observed. Thus, the metal oxide thin film in the form of the two-dimensional nanosheet may be a specific shape formed through the annealing process using the thermal dissipation annealing (TDA) apparatus of the present invention.

In an embodiment of the present invention, the temperature and time of the cooling step in Step 2 may be factors that control the shape of the metal oxide thin film to be crystallized.

In a specific embodiment, when the metal oxide thin film is the ZnO thin film, Step 2 may be performed by setting the cold plate to $-15°$ C. to $-5°$ C., for example, $-11°$ C. to $-9°$ C., for example, $-10°$ C., positioning the lower surface of the base substrate on which the ZnO thin film is deposited on the upper surface of the cold plate, and maintaining the cooling process for 10 seconds to 1 minute, for example, 20 seconds to 40 seconds, for example, 29 seconds to 31 seconds, for example, 30 seconds. However, when the cooling is performed out of the range of cooling temperature and time in Step 2, the ZnO thin film in the form of the two-dimensional nanosheet may not be formed.

For example, when the temperature of the cold plate is greater than 0° C., for example, greater than −5° C., for example, greater than −9° C., for example, greater than −10° C., and the predetermined time is less than 10 seconds, for example, less than 20 seconds, for example, less than 30 seconds, during the annealing process, the difference in temperature between the surface and the bottom of the ZnO thin film is relatively low to allow easy movement of the surface and ZnO particles, thereby increasing the nanosheet density and decreasing the nanosheet size.

On the other hand, when the temperature of the cold plate is less than −15° C., for example, less than −11° C., for example, less than −10° C., and the predetermined time is greater than 1 minute, for example, greater than 40 seconds, for example, greater than 31 seconds, for example, greater than 30 seconds, during the annealing process, ZnO particles on the surface may easily move to the bottom by direct thermal energy, but the movement of the bottom particles is suppressed. Thus, the difference in movement of the ZnO particles on the surface and the bottom increases the size of the nanosheet, while the density may be reduced due to the limited movement of the ZnO particles on the bottom.

In an embodiment of the present invention, Step 3 may be performed by transferring the heat to the surface of the metal oxide thin film by using at least one heat source selected from the group consisting of a halogen lamp, an IR lamp, a UV lamp, a flash lamp, plasma, a laser, a plasma laser, and electron beams.

In a specific embodiment of the present invention, when the metal oxide thin film is the ZnO thin film, Step 3 may be performed by irradiating thermal energy of a temperature of 400° C. to 800° C., for example, 400° C. to 600° C., for example, 450° C. to 550° C., for example, 500° C. to the surface of the ZnO thin film, by using the above-described heat source, for example, an IR lamp, for example, a halogen lamp with high performance to achieve a contactless high-speed temperature control generating IR radiation.

Conventionally, a polymer substrate such as polyethylene terephthalate (PET) and polyethylene naphthalate (PEN) could not be annealed at a high temperature (500° C. or higher) due to low glass transition temperature (130° C.) and melting point (200° C.). However, the method for crystallization of the metal oxide thin film by using thermal dissipation annealing (TDA) of the present invention may anneal the metal oxide thin film at a high temperature without damage to the substrate, and thus has an advantage of performing a high-temperature annealing process regardless of a type of substrate.

In an embodiment of the present invention, the method for crystallization of the metal oxide thin film of the present invention may further include forming a moisture formation prevention space on the upper surface of the metal oxide thin film (Step 2-1), between Steps 2 and 3.

In an embodiment of the present invention, Step 2-1 may be performed by sequentially stacking a frame-shaped spacer layer including an internal space and a cover layer that seals the internal space of the spacer layer from the upper side. In an embodiment of the present invention, the moisture formation prevention space may be formed to prevent moisture from forming on the surface of the metal oxide thin film.

For example, when the annealing process is performed by using the thermal dissipation annealing (TDA) apparatus without including the moisture formation prevention space, due to the cold air of the cold plate, the moisture may be formed on the surface of the metal oxide thin film at a temperature below a dew point, and the moisture may reduce the annealing efficiency and heat transfer rate of the annealing process.

In an embodiment of the present invention, the spacer layer is in the form of a frame including a space in the center and supports the cover layer to form the moisture formation prevention space. The spacer layer is easily processed in a frame shape and may include a material capable of supporting the cover layer, such as mica, quartz, alumina ($Al_2O_3$), graphite, silicon carbide (SiC), ceramics, and metals, but is not limited thereto.

In an embodiment of the present invention, the cover layer serves to uniformly transfer heat to be transmitted from the halogen lamp to the metal oxide thin film while sealing the inner space of the spacer layer from the upper side. The cover layer may include a material capable of uniformly transferring the heat to be transmitted from the halogen lamp, such as mica, quartz, alumina ($Al_2O_3$), graphite, silicon carbide (SiC), ceramics, and metals, but is not limited thereto.

The present invention provides a metal oxide thin film crystallized by using the crystallization method of the metal oxide thin film using the thermal dissipation annealing (TDA) of the aspect and an electronic device including the metal oxide thin film.

In an embodiment of the present invention, the metal oxide thin film may be a ZnO thin film and may be in the form of a two-dimensional nanosheet.

In addition, in an embodiment of the present invention, the electronic device is one or more selected from the group consisting of a display, a battery, a solar cell, a touch panel, a transistor, an electrochemical sensor, a biosensor, and a photodetection sensor, for example, a UV photodetector.

The ZnO corresponds to a suitable material for use in transparent and flexible UV photodetectors due to a wide bandgap energy (3.37 eV), large exciton binding energy (60 meV), high electron mobility in a visible region, and high transparency.

In the related art, in a method of preparing a ZnO thin film for manufacturing the ZnO-based UV photodetector, when the ZnO thin film is deposited using the sol-gel spin coating method, the ZnO thin film becomes amorphous, and the amorphous ZnO thin film has a disadvantage of deteriorating the performance of transparent and flexible photoelectric devices due to a high grain boundary ratio, and research has been conducted on annealing the amorphous ZnO thin film.

The thermal dissipation annealing (TDA) method of the present invention prevents damage to the substrate and may prepare a completely crystallized ZnO thin film, and thus may improve excellent stability and reproducibility, fast rise and decay time constants, high on/off ratio, and high photosensitivity and photoresponsivity, and furthermore, may be used for transparent and flexible ZnO-based UV photodetectors with fast response speed and excellent photocurrent stability.

MODES OF THE INVENTION

EXAMPLE

Example 1. Preparation of ZnO Thin Film

Preparation of ZnO Precursor Solution

Zinc acetate dihydrate ($Zn(CH_3COO)_2 2H_2O$, guaranteed reagent, ≥99.0%, JUNSEI) and monoethanolamine (MEA) ($NH_2CH_2CH_2OH$, ACS reagent, ≥99.0%, Sigma-Aldrich) were dissolved in 2-methoxyethanol ($C_3H_8O_2$, guaranteed reagent, ≥99.0%, JUNSEI) to prepare 0.5 M a ZnO precursor solution. At this time, the MEA was used to stabilize the solution and improve the solubility of a precursor salt, and the molar ratio of the zinc acetate dihydrate and MEA was 1:1.

Thereafter, the ZnO precursor solution was stirred at 60° C. for 2 hours to obtain a transparent and homogeneous solution, and the solution was cooled to room temperature and used as a coating solution for sol-gel spin coating.

Substrate Cleaning

A Si substrate was cleaned with a piranha solution as a mixture of sulfuric acid ($H_2SO_4$) and hydrogen peroxide ($H_2O_2$), cleaned with hydrofluoric acid (HF), washed with deionized water for 2 minutes, and then dried with nitrogen ($N_2$) gas (99.9999%), ultrasonically cleaned with acetone and ethyl alcohol for 10 minutes, rinsed with distilled water for 2 minutes, and then re-dried with nitrogen gas (99.9999%).

Sol-Gel Spin Coating

The prepared ZnO precursor solution was deposited on the cleaned Si substrate and spin-coated at 2,000 rpm for 20 seconds. The spin-coated ZnO thin film was preheated in an oven at 150° C. for 10 minutes, and the spin coating and preheating processes were repeated nine additional times.

Annealing Using Thermal Dissipation Annealing (TDA)

The lower surface of the Si substrate was positioned on a cold plate set at –10° C. in a TDA annealing apparatus and maintained for 30 seconds. After 30 seconds, heat of 500° C. was applied through an IR lamp while maintaining the temperature of the cold plate at –10° C., and the ZnO thin film was annealed for 1 hour.

Example 2. Preparation of ZnO Thin Film

A ZnO thin film was prepared using the same method as Example 1 above, except for using a polyethylene naphthalate (PEN) substrate instead of the Si substrate, ultrasonically cleaning the PEN substrate with isopropyl alcohol for 20 minutes in a substrate cleaning process, rinsing the PEN substrate with distilled water for 2 minutes, and then drying the PEN substrate with nitrogen gas (99.9999%), from Example 1.

Comparative Example 1-1. Preparation of ZnO Thin Film (Unannealed)

A ZnO thin film was prepared in the same manner as in Example 1, except for not performing the annealing process from Example 1.

Comparative Example 1-2. Preparation of ZnO Thin Film (Using Furnace)

A ZnO thin film was prepared by performing the same method as in Example 1, except for annealing at 500° C. in a furnace, instead of annealing using TDA in Example 2.

Comparative Example 1-3. Preparation of ZnO Thin Film (Using Infrared Lamp)

A ZnO thin film was prepared by performing the same method as in Example 1, except for annealing at 500° C. using only an IR lamp, instead of annealing using TDA in Example 1.

Comparative Examples 1~4 and 1-5. Preparation of ZnO Thin Film

A ZnO thin film was prepared by performing the same method as in Example 1, except for setting the time for maintaining the lower surface of the Si substrate on the cold plate to 10 seconds and 180 seconds, respectively, instead of 30 seconds in Example 1.

Comparative Examples 1-6 and 1-7. Preparation of ZnO thin film

A ZnO thin film was prepared by performing the same method as in Example 1, except for setting the temperature of the cold plate to 10° C. to 20° C. instead of –10° C. in Example 1.

Comparative Example 2. Preparation of ZnO Thin Film (Unannealed)

A ZnO thin film was prepared by performing the same method as in Example 2, except for not performing the annealing process, from Example 2.

The preparation conditions of the ZnO thin films prepared in Example 1, Example 2, Comparative Examples 1-1 to 1-7, and Comparative Example 2 were shown in Table 1 below:

TABLE 1

| | Substrate | Annealing | Cold plate maintaining time (sec) | Cold plate temperature (° C.) | Annealing temp. (° C.) |
|---|---|---|---|---|---|
| Example 1 | Si | TDA(Cold plate + IR lamp) | 30 | −10 | 500 |
| Com. Ex. 1-1 | | Unannealed | — | — | |
| Com. Ex. 1-2 | | furance | | | |
| Com. Ex. 1-3 | | IR lamp | | | |
| Example 2 | PEN | TDA(Cold plate + IR lamp) | 30 | −10 | |
| Com. Ex. 2 | | unannealed | — | — | |
| Com. Ex. 1-4 | Si | TDA((Cold plate + IR lamp) | 10 | −10 | |
| Com. Ex. 1-5 | | | 180 | | |
| Com. Ex. 1-6 | | | 30 | 10 | |
| Com. Ex. 1-7 | | | | 20 | |

Experimental Example 1. Shape, Structure, and PL
Analysis of ZnO Thin Films

Shape Analysis of ZnO Thin Films

The shapes of the ZnO thin films prepared in Example 1, Example 2, Comparative Examples 1-1 to 1-7, and Comparative Example 2 were measured using FE-SEM (TESCAN NIRA3LM) with an acceleration voltage of 30 kV and FE-TEM (FEI TF30ST) with a voltage of 300 kV and an SAED function.

FIG. 4 shows FE-SEM images of the ZnO thin films of Example 1 and Comparative Examples 1-1 to 1-3, FIG. 5 shows FE-SEM images of the ZnO thin films of Example 2 and Comparative Example 2, FIG. 6 shows an HRTEM image (a) and a selected-area electron diffraction (SAED) pattern image (b) of the ZnO thin film of Example 1, FIG. 7 shows FE-SEM images of Comparative Examples 1~4 and 1-5, and FIG. 8 shows FE-SEM images of Comparative Examples 1-6 and 1-7.

Referring to FIGS. 4 and 5, the unannealed ZnO thin films of Comparative Examples 1-1 and 2 had a wrinkled network structure consisting of dense grains of agglomerated ZnO nanoparticles, and it was confirmed that slight cracks between the wrinkled network structures were observed.

A fibrous structure formed by agglomerating ZnO particles was observed on the surfaces of the ZnO thin films of Comparative Examples 1-2 and 1-3 and compared to the unannealed ZnO thin film of Comparative Example 1-1 or 2, the sizes of the ZnO particles increased and the cracks disappeared, and thus, it was confirmed that each ZnO thin film was annealed and crystallized.

On the other hand, it was confirmed that the surfaces of the ZnO thin films of Examples 1 and 2 annealed using the TDA apparatus were observed in the form of a two-dimensional nanosheet such as graphene.

In the case of the ZnO thin films of Comparative Examples 1-2 and 1-3, the sizes of the nanoparticles increased, but no change in shape was observed due to movement of ZnO molecules. In the case of thermal annealing of the ZnO thin film without a cold plate, it was confirmed that the nanoparticle size of the ZnO thin film increased and cracks between the wrinkled network structures decreased due to Ostwald ripening, but the mobility of ZnO molecules on the surface and the bottom was not different, and thus there was no change in shape.

Referring to FIG. 6, it was seen that the HRTEM image of the ZnO thin film of Example 1 showed a clear and continuous aligned lattice pattern and did not show disordered areas to have the characteristics of a single crystal. It was confirmed that a striped lattice with an interval of 0.26 nm matched an interplanar distance in a (002) direction of ZnO with a wurtzite structure. In addition, as can be seen in the SAED pattern image, dots with uniform intervals were observed, and as a result, it was confirmed that the amorphous ZnO thin film was crystallized into a single crystal through the TDA process.

Referring to a) of FIG. 7, it was confirmed that in the case of the ZnO thin film of Comparative Example 1-4, the size of the ZnO nanosheet was small and the density increased compared to the ZnO thin film of Example 1, and referring to b) of FIG. 7, it was confirmed that in the case of the ZnO thin film of Comparative Example 1-5, the size of the ZnO nanosheet was larger than that of the ZnO thin film of Example 1.

Referring to a) of FIG. 8, it was confirmed that in the case of the ZnO thin film of Comparative Example 1-6, the number of ZnO nanosheets was decreased compared to the ZnO thin film of Example 1, and referring to b) of FIG. 8, it was confirmed that in the case of the ZnO thin film of Comparative Example 1-7, the ZnO nanosheet was not observed.

Through FIGS. 7 and 8, it was confirmed that when using the TDA process, the temperature and cooling time of the cold plate affected the size, number, and density of ZnO nanosheets in the crystallized ZnO thin film.

XRD Analysis

The crystalline phases of the ZnO thin films prepared in Example 1, Example 2, Comparative Examples 1-1 to 1-3, and Comparative Example 2 were analyzed by XRD (PANalytical X'Pert Pro) using a Cu-K$\alpha$ radiation source ($\lambda$.nm) at an acceleration voltage of 40 kV, and the results were illustrated in FIG. 9.

Referring to FIG. 9, no diffraction pattern was observed in the ZnO thin films of Comparative Examples 1-1 and 2, and as a result, it could be seen that the crystalline state of the unannealed ZnO thin film was in an amorphous state.

On the other hand, it was confirmed that the ZnO thin films of Comparative Examples 1-2 to 1-3 were converted from amorphous to polycrystalline, and it could be seen that in the ZnO thin films of Examples 1 and 2, diffraction patterns could be observed at 34.6°, a strong diffraction peak caused from a ZnO (002) plane, and 36.4°, a weak diffraction peak caused from a ZnO (101) plane, and thus crystallized through TDA annealing.

Photoluminescence (PL) Analysis

Photoluminescence (PL) was analyzed by using an He—Cd laser (325 nm) with an excitation power of 20 mV and a 0.75 m single-grating monochromator with a photomultiplier tube.

Figure 11:
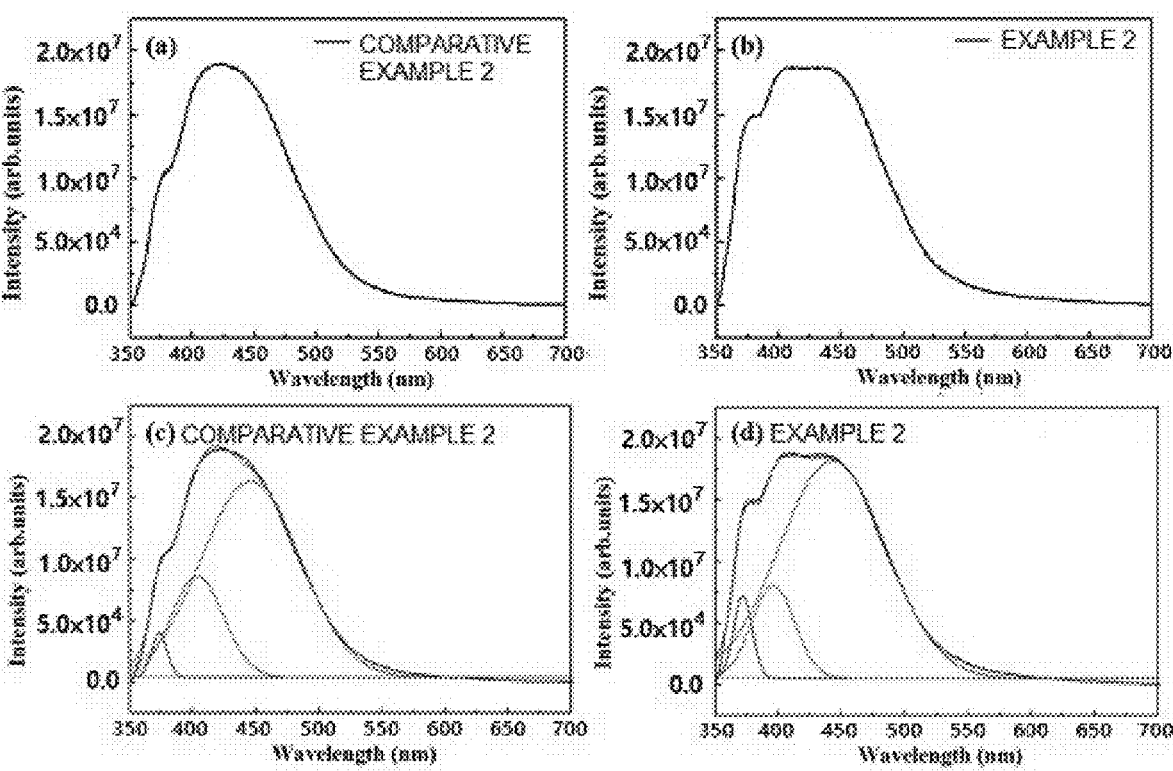

FIG. 10 shows PL spectra of Example 1 and Comparative Examples 1-1 to 1-3, and FIG. 11 shows PL spectra (a and b) of Example 2 and Comparative Example 2 and Gaussian fitting analysis (c and d) of the PL spectra.

Referring to FIG. 10, it was confirmed that the ZnO thin film of Example 1 had near-band-edge (NBE) luminescence improved about 3 times compared to the ZnO thin films of Comparative Examples 1-2 and 1-3, and the intensity of deep-level (DL) luminescence associated with defects was also relatively low.

In general, NBE luminescence from zinc oxide thin films was generated by the recombination of excitons present in zinc oxide, and DL luminescence was shown by various defects (interstitial oxygen, interstitial zinc, oxygen vacancies, zinc vacancies, etc.) present in the lattice.

Since the ZnO thin film of Example 1 with high intensity of NBE luminescence and low intensity of DL luminescence had a relatively large surface area and a low defect density (high crystallinity), the ZnO thin film was suitable to be used as photoelectric devices, but it was expected that the ZnO thin films of Comparative Examples 1-2 and 1-3 with low intensity of NBE luminescence and high intensity of DL luminescence had limitations to be used as photoelectric devices due to low crystallinity and narrow surface area.

Referring to FIG. 11, it was confirmed that the PL spectrum of the ZnO thin film of Comparative Example 2 consisted of two bands with peaks at about 380 nm and 425 nm, and the PL spectrum of the ZnO thin film of Example 2 consisted of two bands with peaks at about 380 nm and 420 nm.

The peak observed at 380 nm was caused by NBE (near-band-edge) emission of the ZnO thin film due to recombination of free excitons, and 420 nm and 425 nm substantially observed were unclear, so that the PL spectrum of the ZnO thin film was fitted using a Gaussian function.

Due to the fitting, PL spectra were obtained with three Gaussian functions with peaks centered at 380 nm, 400 nm and 440 nm. With the NBE emission centered at 380 nm, which was caused by the recombination of free excitons in ZnO, the intensity of the NBE emission increased in Example 1. Due to the broad emission centered at 400 nm and 440 nm, it did not experience a change in emission intensity and was likely to be derived from the PEN substrate.

It was confirmed that the NBE emission intensity of the ZnO thin film of Example 2 was clearly improved compared to the ZnO thin film of Comparative Example 2 so that the crystallinity of the ZnO thin film was improved.

Confirmation of Transparency of ZnO Thin Films

The transparency of ZnO thin films was measured using UV-visible spectroscopy (Thermo Scientific Evolution 220).

FIG. 12 illustrates an image (a) of the ZnO thin film of Example 2 and results of measuring the light transmittance of a PEN substrate, a ZnO thin film of Example 2, and a ZnO thin film of Comparative Example 2.

Referring to (a) of FIG. 12, it was confirmed that the ZnO thin film of Example 2 had high transparency, so that the PEN substrate was not melted or deformed and maintained flexibility and transparency even during the high-temperature annealing process.

Referring to (b) of FIG. 12, it could be seen that the PEN substrate exhibited the transmittance of approximately 90% at wavelengths ranging from 400 nm to 900 nm, and the ZnO thin film of Example 2, which was deposited and annealed on the PEN substrate, showed the transmittance similar to that of the pure PEN substrate, so that the deposition and annealing process had little effect on the transparency of the ZnO thin film.

Experimental Example 2. Confirmation of Photoresponsivity of ZnO Thin Film

In order to investigate the effect on the UV photoresponse of the ZnO thin films prepared in Example 1, Example 2, Comparative Examples 1-1 to 1-3, and Comparative Example 2, a metal-semiconductor-metal (MSM) UV photodetector based on the ZnO thin film was manufactured.

The MSM UV photodetector was manufactured by depositing an indium (In) electrode on a ZnO thin film through thermal evaporation with a metal shadow mask, and the photoresponse change was measured at a bias voltage of 0.1 V using UV light ($\lambda$=365 nm) with a power density of 10 mWcm$^2$. At this time, the active area of the MSM UV photodetector was about 1.6 cm$^2$.

FIG. 13 illustrates results of photoresponse according to the time measured by periodically turning on and off UV light ($\lambda$=365 nm) in the air in the UV photodetector manufactured using the ZnO thin films of Example 1, Example 2, Comparative Examples 1-1 to 1-3, and Comparative Example 2.

Referring to FIG. 13, it was confirmed that in the case of the ZnO thin films of Examples 1 and 2, the photocurrent was rapidly increased and saturated as soon as ultraviolet light was turned on, thereby exhibiting excellent stability and reproducibility. Specifically, it was confirmed that the photocurrent value of the ZnO thin film of Example 1 increased by about 30 times compared to the ZnO thin films of Comparative Examples 1-1 to 1-3 under the same measurement conditions (power density of UV light, temperature, humidity, etc.), and the photocurrent value of the ZnO thin film of Example 2 increased by 5.29 times compared to the ZnO thin film of Comparative Example 2 under the same conditions.

A typical disadvantage of conventional ZnO thin film-based UV photodetectors was the slow rise and decay of the photocurrents. When UV illumination started, the amount of photogenerated electrons was greater than the amount of reabsorbed oxygen molecules, but the combination of reabsorbed oxygen molecules and free electrons increased with the illumination time to slowly increase the photocurrent. When the UV illumination was turned off, an instantaneous recombination of photogenerated electron-hole pairs occurred, so that the photocurrent was rapidly reduced in the initial part of the decay process and resorption of oxygen molecules reacting with free excitons was generated, and the photocurrent on the ZnO thin film surface was slowly reduced.

However, in the case of the ZnO thin films of Examples 1 and 2 annealed using the TDA process, it was confirmed that the photocurrent showed a rapid increase and decrease, and a stable photocurrent occurred during repeated on/off cycling of UV light. This could be expected to be due to a high surface-to-volume ratio, which increased the amount of oxygen ions trapped on the surface of the ZnO thin film, and a perfect single crystal structure of the ZnO thin film.

In addition, in order to compare the performance of the UV photodetector, the photosensitivity and photoresponsivity of the ZnO thin films of Example 1 and Comparative Examples 1-1 to 1-3 were calculated using Equation 1 below, and the results were illustrated in FIG. 14:

$$S = \frac{I_{ph}}{I_{dark}} \qquad \text{[Equation 1]}$$

$$R = \frac{I_{ph} - I_{dark}}{P_{op}}$$

In Equation 1, S is the photosensitivity of the ZnO thin film, $I_{ph}$ is the photocurrent, $I_{dark}$ is the dark current, R is the photoresponsivity, and Pop is the light output of the UV source (10 mW/cm$^2$).

Figure 14:
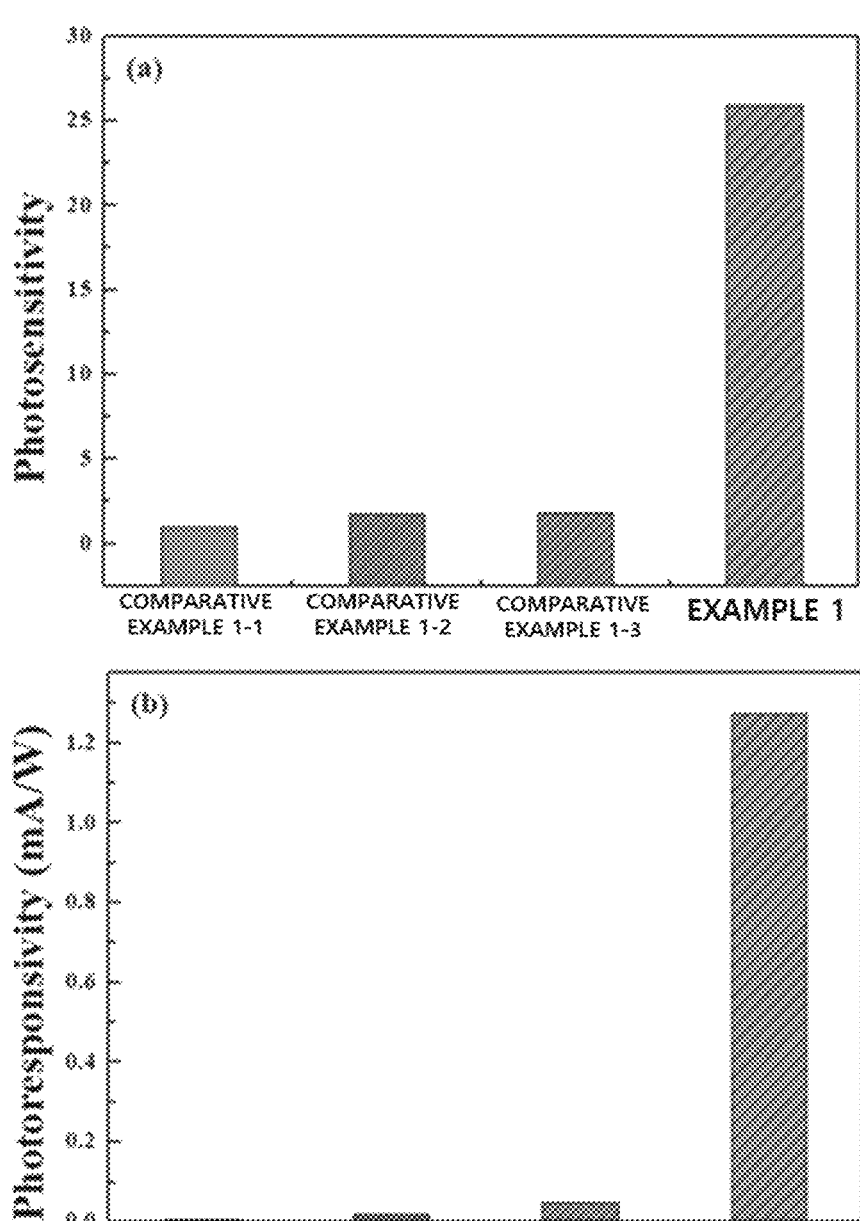
FIG. 14 illustrates calculation results of photosensitivity and photoresponsivity of ZnO thin films of Example and Comparative Example of the present invention.

Referring to FIG. 14, it was confirmed that the photosensitivity of the ZnO thin film of Example 1 clearly increased by about 15 times compared to the ZnO thin films of Comparative Examples 1-1 to 1-3, and the photoresponsivity increased by 228 times compared to Comparative Example 2-1, 60 times compared to Comparative Example 2-2, and 26 times compared to Comparative Example 2-3.

As a result, it could be expected that the annealing process using TDA was a suitable method to solve the typical disadvantages of ZnO thin film-based UV photodetectors, which had low on/off current ratio, low sensitivity, and low photocurrent stability.

In addition, in order to investigate the photoresponse speed of the ZnO thin film, rise and decay time constants of photocurrents of the ZnO thin films of Example 1, Example 2, Comparative Examples 1-1 to 1-3, and Comparative Example 2 were calculated using a biexponential fit represented by Equation 2 below:

$$I(t) = I_0 + A_1\left(1 - e^{-\frac{t}{\tau_{r1}}}\right) + A_2\left(1 - e^{-\frac{t}{\tau_{r2}}}\right) \qquad \text{[Equation 2]}$$

$$I(t) = I_0 + A_3 e^{-\frac{t}{\tau_{d1}}} + A_4 e^{-\frac{t}{\tau_{d2}}}$$

In Equation 2, $I_0$ is the dark current, $A_1$, $A_2$, $A_3$ and $A_4$ are positive constants, $\tau_{r1}$ and $\tau_{r2}$ are rise time constants, and $\tau_{d1}$ and $\tau_{d2}$ are decay time constants.

Figure 15:
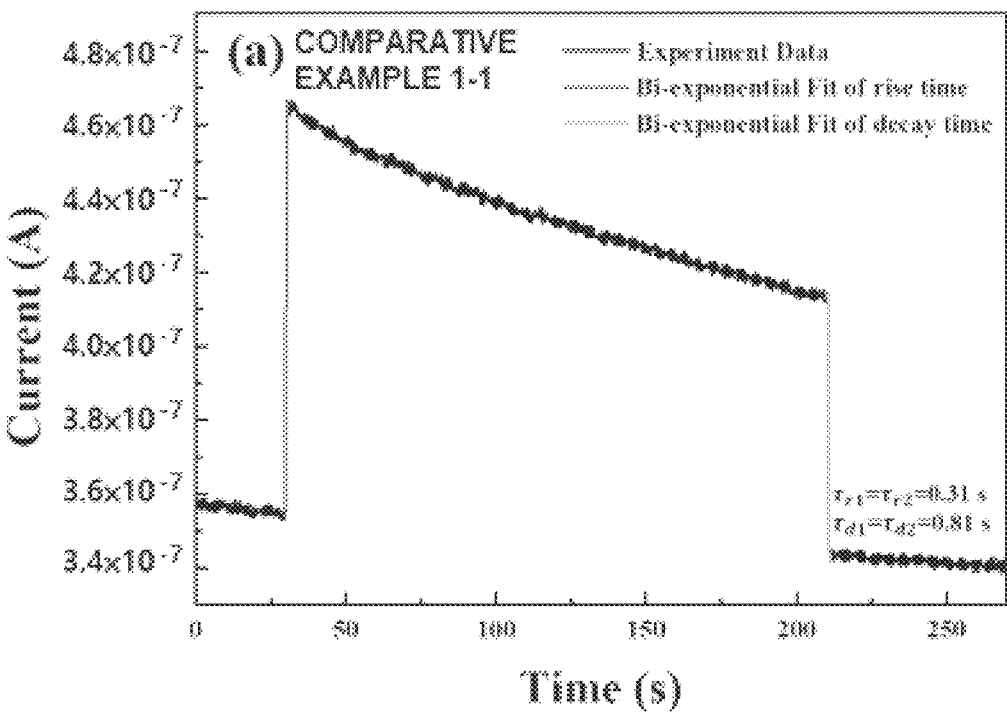

FIG. 15-1 to FIG. 15-3 show rise and decay graphs of photoresponse curves for the thin films of Example 1, Example 2, Comparative Examples 1-1 to 1-3, and Comparative Example 2.

Referring to FIG. 15-1 to FIG. 15-3, based on curve fitting, estimated rise ($\tau_{r1}$ and $\tau_{r2}$) and decay ($\tau_{d1}$ and $\tau_{d2}$) time constants of the ZnO thin film of Comparative Example 1-1 were 0.31 seconds and 0.81 seconds, respectively, and in the case of the ZnO thin films of Comparative Examples 1-2 and 1-3, the rise time constants (Tt) were 1184.78 seconds and 132.01 seconds, and 442.45 seconds and 2572.81 seconds, respectively, and the decay time constants ($\tau$ and $\tau$) were 1881.47 seconds and 303.06 seconds, and 1171.23 seconds and 11,168.47 seconds, respectively. It could be seen that in the case of the ZnO thin film of Example 1, the rise ($\tau_{r1}{=}\tau_{r2}$) and decay ($\tau_{d1}{=}\tau_{d2}$) time constants were 35 ms and 73 ms, respectively, and the expected rise ($\tau_{r1}$ and $\tau_{r2}$) and decay ($\tau_{d1}$ and $\tau_{d2}$) time constants of the ZnO thin film of Example 2 were 0.69 seconds, 2.58 seconds, 0.48 seconds, and 2.44 seconds, respectively.

It was confirmed that the ZnO thin films of Examples 1 and 2 had excellent photocurrent stability, high on/off current ratio, high sensitivity, and faster rise and decay time constants.

and flexible photodetectors with fast response, high photosensitivity, high photosensitivity, and excellent photocurrent stability.

Hereinabove, the present invention has been described with reference to preferred embodiments thereof. It will be understood to those skilled in the art that the present invention may be implemented as modified forms without departing from an essential characteristic of the present invention. Therefore, the disclosed embodiments should be considered in an illustrative viewpoint rather than a restrictive viewpoint. The scope of the present invention is defined by the appended claims rather than by the foregoing description, and all differences within the scope of equivalents thereof should be construed as being included in the present invention.

INDUSTRIAL APPLICABILITY

A method for crystallization of a metal oxide thin film by using thermal dissipation annealing (TDA) of the present invention exhibits an effect of enabling high-temperature thermal annealing, which is essential for the performance improvement of a semiconductor material, a sensor material, and the like deposited on a thin-plate substrate, even without

TABLE 2

| Sample | Graphene/ZnO | ZnO/GO | ZnO/graphene | ZnO nanoneedle | ZnO Thin film |
|---|---|---|---|---|---|
| Dark current | 310 µA | 0.4 µA | 0.0221 µA | 20 nA | 0.871 µA |
| photocurrent | 518 µA | 1.5 µA | 0.9205 µA | 300 nA | 1.85 µA |
| rise time constant ($T_{r1}$) | 24.89 s | 11.2 s | 69.73 s | 27 s | 0.69 s |
| rise time constant ($T_{r2}$) | — | — | — | 27 s | 2.58 s |
| decay time constant ($d_{r1}$) | 30.65 s | 81 s | 80.94 s | 7 s | 0.48 s |
| decay time constant ($d_{r2}$) | — | — | — | 40 s | 2.44 s |
| Bias voltage (V) | 3 | 5 | 2 | 0.3 | 0.1 |
| Ref. | K. B. Ko et al. (2019) | T. AlZoubi et al. (2018) | K. S. Lee et al. (2020) | D. Gedamu et al (2014) | Example 2 (This work) |

Table 2 above is a table of comparing the ZnO thin film of Example 2 with previously reported studies on ZnO-based transparent and flexible UV photodetectors.

Referring to Table 2 above, compared to most of the previous studies, it was confirmed that the UV photodetector prepared using the ZnO thin film of Example 2 showed the best performance in terms of the fastest rise/decay time at the lowest bias voltage.

However, in general, the values of dark current and photocurrent affected the bias voltage value, and accurate comparison of UV photodetector performance was impossible at different bias voltages. When comparing the rise and decay time constants of the UV photodetector that was not affected by bias voltage, compared to previously reported studies, it was confirmed that the ZnO-based photodetector of Example 2 was superior in terms of the fastest rise and decay time constants and had a high increase in photocurrent at the lowest bias voltage.

Therefore, the TDA method of the present invention may improve the rise and decay speed of the photocurrent by forming a large surface area and reducing the number of defects in the ZnO thin film.

In addition, as the result, it was confirmed that the TDA method was an effective route for manufacturing transparent degrading the performance of the thin-plate substrate. In addition, a metal oxide thin film prepared by the method of the present invention is in the form of a two-dimensional nanosheet, and thus may have a low defect density (high crystallinity) and a wide surface area. Accordingly, based on the improved photosensitivity and photoreactivity, the metal oxide thin film may be utilized in a high-performance photoelectric device.

The invention claimed is:

1. A thermal dissipation annealing (TDA) apparatus comprising:

a base substrate on which a material is to be deposited;

a cold plate positioned below the base substrate and configured to cool the base substrate;

a heat source unit disposed above the substrate and configured to anneal the material, a spacer layer which is in the form of a frame including an internal space, and stacked and positioned above the substrate; and a cover layer which is stacked above the spacer layer and seals the internal space of the spacer layer from an upper side, wherein the spacer layer and the cover layer form a moisture formation prevention space on the material.

2. The TDA apparatus of claim 1, wherein the base substrate is one type selected from the group consisting of a polymer substrate, a glass substrate, a metal substrate, a ceramic substrate, and a semiconductor substrate.

3. The TDA apparatus of claim 2, wherein the polymer substrate is one type selected from the group consisting of polyimide (PI), polycarbonate (PC), polyethylene naphthalate (PEN), polyethylene terephthalate (PET), and polyethersulfone (PES).

4. The TDA apparatus of claim 1, wherein the material includes at least one selected from the group consisting of tin oxide (SnO), indium oxide ($In_2O_3$), zinc indium oxide (ZIO), indium galluim oxide (IGO), zinc tin oxide (ZTO), indium gallium zinc oxide (IGZO), copper oxide (CuO), cadmium oxide (CdO), aluminum oxide ($Al_2O_3$), tungsten oxide ($W_2O_3$), titanium oxide ($TiO_2$) and zinc oxide (ZnO).

5. The TDA apparatus of claim 1, wherein the material is deposited by a method selected from the group consisting of a sol-gel coating method, chemical vapor deposition, metal-organic chemical vapor deposition, physical vapor deposition, molecular beam epitaxy, a hydrothermal method, and pulse laser deposition.

6. The TDA apparatus of claim 1, wherein the heat source unit includes at least one heat source selected from the group consisting of a halogen lamp, an IR lamp, a UV lamp, a flash lamp, plasma, a laser, a plasma laser, and electron beams.

7. The TDA apparatus of claim 1, wherein the spacer layer includes at least one selected from the group consisting of mica, quartz, alumina (Al2O3), graphite, and silicon carbide (SiC).

8. The TDA apparatus of claim 1, wherein the cover layer includes at least one selected from the group consisting of mica, quartz, alumina ($Al_2O_3$), graphite, and silicon carbide (SiC).

\* \* \* \* \*